(12) United States Patent
Hahakura et al.

(10) Patent No.: US 10,906,171 B2
(45) Date of Patent: Feb. 2, 2021

(54) MOTOR UNIT AND ROBOT

(71) Applicant: Seiko Epson Corporation, Tokyo (JP)

(72) Inventors: Seiji Hahakura, Azumino (JP);
Hidenori Hama, Shimosuwa (JP);
Yoshiteru Nishimura, Shiojiri (JP);
Kotaro Sekine, Matsumoto (JP);
Mamoru Adachi, Matsumoto (JP)

(73) Assignee: Seiko Epson Corporation

( * ) Notice: Subject to any disclaimer, the term of this patent is extended or adjusted under 35 U.S.C. 154(b) by 919 days.

(21) Appl. No.: 15/608,018

(22) Filed: May 30, 2017

(65) Prior Publication Data

US 2017/0341223 A1 Nov. 30, 2017

(30) Foreign Application Priority Data

| May 30, 2016 | (JP) | 2016-107467 |
| Aug. 31, 2016 | (JP) | 2016-168983 |
| Aug. 31, 2016 | (JP) | 2016-168984 |
| Aug. 31, 2016 | (JP) | 2016-168985 |
| Sep. 2, 2016 | (JP) | 2016-171540 |
| Feb. 16, 2017 | (JP) | 2017-027225 |

(51) Int. Cl.
| *H05K 7/20* | (2006.01) |
| *B25J 9/04* | (2006.01) |
| *H02K 11/33* | (2016.01) |
| *B25J 19/00* | (2006.01) |
| *B25J 9/00* | (2006.01) |

(52) U.S. Cl.
CPC .......... *B25J 9/044* (2013.01); *B25J 9/0009* (2013.01); *B25J 19/0029* (2013.01); *B25J 19/0054* (2013.01); *B25J 19/0075* (2013.01); *H02K 11/33* (2016.01); *B25J 9/042* (2013.01); *H05K 7/20* (2013.01)

(58) Field of Classification Search
None
See application file for complete search history.

(56) References Cited

U.S. PATENT DOCUMENTS

| 5,000,653 | A | * | 3/1991 | Gosdowski | B25J 9/042 |
| | | | | | 414/744.5 |
| 5,523,662 | A | * | 6/1996 | Goldenberg | B25J 9/06 |
| | | | | | 318/568.11 |
| 5,658,121 | A | * | 8/1997 | Hashimoto | B25J 13/00 |
| | | | | | 414/744.1 |
| 7,347,120 | B2 | | 3/2008 | Friedrich et al. | |
| 9,647,513 | B2 | * | 5/2017 | Park | H02K 7/116 |

(Continued)

FOREIGN PATENT DOCUMENTS

| EP | 3162513 A2 | 5/2017 |
| JP | 2007-037238 A | 2/2007 |

(Continued)

OTHER PUBLICATIONS

Extended European Search Report for Application No. EP 17 17 3214 dated Nov. 7, 2017 (7 pages).

*Primary Examiner* — Courtney L Smith

(74) *Attorney, Agent, or Firm* — Harness, Dickey & Pierce, P.L.C.

(57) ABSTRACT

A motor unit includes a motor and an amplifier section including a drive circuit that drives the motor. The amplifier section includes an amplifier cover. A power line for supplying power to the motor is bound to the amplifier cover.

18 Claims, 26 Drawing Sheets

(56) References Cited

U.S. PATENT DOCUMENTS

| | | | |
|---|---|---|---|
| 9,706,672 B2* | 7/2017 | Ushio | B62D 5/0406 |
| 2004/0222764 A1 | 11/2004 | Miura et al. | |
| 2005/0011294 A1* | 1/2005 | Hashimoto | B25J 9/06 |
| | | | 74/490.01 |
| 2005/0087034 A1* | 4/2005 | Friedrich | B25J 9/044 |
| | | | 74/490.03 |
| 2015/0100159 A1* | 4/2015 | Park | H02K 11/21 |
| | | | 700/258 |
| 2016/0036289 A1 | 2/2016 | Kawata et al. | |
| 2016/0036296 A1* | 2/2016 | Kabune | H02K 11/21 |
| | | | 180/446 |
| 2017/0015347 A1* | 1/2017 | Asao | H02K 11/33 |
| 2017/0120435 A1 | 5/2017 | Palich et al. | |
| 2017/0133906 A1 | 5/2017 | Pfeiffer et al. | |
| 2018/0013360 A1 | 1/2018 | Eshleman et al. | |
| 2018/0207805 A1* | 7/2018 | Tokushima | B25J 13/088 |

FOREIGN PATENT DOCUMENTS

| | | |
|---|---|---|
| WO | WO-2010-090360 A1 | 8/2010 |
| WO | WO-2016-005126 A1 | 1/2016 |

* cited by examiner

MOTOR UNIT AND ROBOT

BACKGROUND

1. Technical Field

The present invention relates to a motor unit and a robot.

2. Related Art

The research and development of amplifiers that drive motors have been conducted.

With regard to this, a servo amplifier-integrated servomotor is known (see JP-A-2007-37238). The servo amplifier-integrated servomotor includes: a servomotor including a motor section including a stator and a rotor, and a sensor section including a sensor and a sensor processing circuit; and a servo amplifier including a drive circuit that drives the motor, a control circuit that controls the drive circuit, and a communication circuit, in which the servo amplifier is attached to the axial end portion of the servomotor.

Moreover, articulated robots including a plurality of arms are used in industrial fields and the like. It is known in the articulated robot to provide, together with a motor, a drive circuit that drives the motor inside the arm (see U.S. Pat. No. 7,347,120).

However, wires are not managed in the servo amplifier-integrated servomotor disclosed in JP-A-2007-37238, so that the wire interferes with other objects in some cases. As a result, in the servo amplifier-integrated servomotor, the wire is broken or noise that changes the waveform of a current flowing through the wire is increased in some cases. Moreover, in the servo amplifier-integrated servomotor, the shape or position of the wire at the time of assembly varies in some cases, so that it is difficult to improve quality after assembly or the efficiency of assembly work.

In recent years, a horizontal articulated robot is used in industrial fields. One example of the horizontal articulated robot includes a SCARA robot. A plurality of servomotors are used in the SCARA robot. Therefore, it is considered to use the servo amplifier-integrated servomotor described above (hereinafter referred to as "amplifier-integrated motor). For example, a motor that rotates a first arm relative to a base in the SCARA robot requires an output larger than the outputs of other motors. Therefore, the amplifier-integrated motor has a risk that the vibration or heat from the motor may influence the amplifier.

Moreover, the articulated robot disclosed in U.S. Pat. No. 7,347,120 has a problem in that the size of the arm is increased when the drive circuit (amplifier section) is provided inside the arm, and as a result, the range of movement of the arm is narrowed.

SUMMARY

An advantage of some aspects of the invention is to make an arm compact by increasing the flexibility of arrangement of a motor and an amplifier section.

Aspect 1

One aspect of the invention is directed to a motor unit including: a motor; and an amplifier section including a drive circuit that drives the motor, wherein the amplifier section includes an amplifier cover, and a power line for supplying power to the motor is bound to the amplifier cover.

With this configuration, in the motor unit, the amplifier section includes the amplifier cover, and the power line for supplying power to the motor is bound to the amplifier cover. Thus, in the motor unit, it is possible to prevent the power line from interfering with other objects.

Aspect 2

In another aspect of the invention, the motor unit may employ a configuration in which the power line is bound to the outside of the amplifier cover.

With this configuration, in the motor unit, the power line is bound to the outside of the amplifier cover. Thus, in the motor unit, it is possible to prevent the power line bound to the outside of the amplifier cover from interfering with other objects.

Aspect 3

In another aspect of the invention, the motor unit may employ a configuration in which another wire is not interposed between the amplifier cover and the power line.

With this configuration, in the motor unit, another wire is not interposed between the amplifier cover and the power line. Thus, in the motor unit, it is possible to prevent a change in the waveform of a current flowing through the power line from changing the waveform of a current flowing through another wire.

Aspect 4

In another aspect of the invention, the motor unit may employ a configuration in which the motor unit further includes a waterproof cover covering at least one of the motor and the amplifier section.

With this configuration, the motor unit includes the waterproof cover covering at least one of the motor and the amplifier section. Thus, in the motor unit, water resistance can be improved.

Aspect 5

In another aspect of the invention, the motor unit may employ a configuration in which the amplifier section includes a heat dissipating member.

With this configuration, in the motor unit, the amplifier section includes the heat dissipating member. Thus, in the motor unit, it is possible to prevent the occurrence of trouble due to heat generated by the amplifier section.

Aspect 6

In another aspect of the invention, the motor unit may employ a configuration in which the material of the heat dissipating member is metal.

With this configuration, in the motor unit, the amplifier section includes the heat dissipating member whose material is metal. Thus, in the motor unit, it is possible by the heat dissipating member of metal to prevent the occurrence of trouble due to heat generated by the amplifier section.

Aspect 7

In another aspect of the invention, the motor unit may employ a configuration in which the material of the heat dissipating member is any of iron, aluminum, and copper.

With this configuration, in the motor unit, the amplifier section includes the heat dissipating member whose material is any of iron, aluminum, and copper. Thus, in the motor unit, it is possible by the heat dissipating member whose material is any of iron, aluminum, and copper to prevent the occurrence of trouble due to heat generated by the amplifier section.

Aspect 8

In another aspect of the invention, the motor unit may employ a configuration in which the heat dissipating member can attach the amplifier section to the motor.

With this configuration, in the motor unit, the heat dissipating member can attach the amplifier section to the motor. Thus, in the motor unit, the motor and the amplifier section can be integrated together.

Aspect 9

In another aspect of the invention, the motor unit may employ a configuration in which the heat dissipating member can attach the amplifier section to an object other than the motor.

With this configuration, in the motor unit, the heat dissipating member can attach the amplifier section to an object other than the motor. Thus, in the motor unit, it is possible to improve flexibility in selecting a position for assembling to an assembly object.

Aspect 10

In another aspect of the invention, the motor unit may employ a configuration in which the heat dissipating member includes a first opening.

With this configuration, in the motor unit, the heat dissipating member includes the first opening. Thus, in the motor unit, a desired portion of the amplifier section that is not wanted to be covered by the heat dissipating member can be opened to the outside through the first opening.

Aspect 11

In another aspect of the invention, the motor unit may employ a configuration in which the amplifier section includes an amplifier board and a cushioning member is disposed between the amplifier board and the heat dissipating member.

With this configuration, in the motor unit, the amplifier section includes the amplifier board, and the cushioning member is disposed between the amplifier board and the heat dissipating member. Thus, in the motor unit, it is possible to prevent the deformation of the amplifier board when the heat dissipating member is attached to the amplifier board.

Aspect 12

The motor unit according to Aspect 11 may employ a configuration in which a heat dissipating sheet is disposed between the amplifier board and the heat dissipating member.

With this configuration, in the motor unit, the heat dissipating sheet is disposed between the amplifier board and the heat dissipating member. Thus, in the motor unit, the cushioning member and the heat dissipating sheet can be filled between the amplifier board and the heat dissipating member, and it is possible to prevent the occurrence of trouble due to heat generated by the amplifier section.

Aspect 13

The motor unit according to any of Aspects 5 to 10 may employ a configuration in which the amplifier section includes an amplifier board and a heat dissipating sheet is disposed between the amplifier board and the heat dissipating member.

With this configuration, in the motor unit, the amplifier section includes the amplifier board, and the heat dissipating sheet is disposed between the amplifier board and the heat dissipating member. Thus, in the motor unit, the heat dissipating sheet can be filled between the amplifier board and the heat dissipating member, and it is possible to prevent the occurrence of trouble due to heat generated by the amplifier section.

Aspect 14

Another aspect of the invention is directed to a robot including the motor unit described above.

With this configuration, in the robot, the amplifier section includes the amplifier cover, and the power line for supplying power to the motor is bound to the amplifier cover. Thus, in the robot, it is possible to prevent the power line from interfering with other objects.

Aspect 15

In another aspect of the invention, the robot may employ a configuration in which the robot further includes a housing and the amplifier section can be attached to the housing.

With this configuration, in the robot, the amplifier section can be attached to the housing. Thus, in the robot, it is possible by the housing to prevent the occurrence of trouble due to heat generated by the amplifier section.

Aspect 16

In another aspect of the invention, the robot may employ a configuration in which the amplifier section is located inside the housing.

With this configuration, in the robot, the amplifier section is located inside the housing. Thus, since the amplifier section can be attached to an object other than the motor, it is possible to improve flexibility in selecting a position for assembling to an assembly object in the motor unit.

Aspect 17

In another aspect of the invention, the robot may employ a configuration in which the housing is movable.

With this configuration, in the robot, the housing is movable. Thus, in the robot, it is possible by the movable housing to more reliably prevent the occurrence of trouble due to heat generated by the amplifier section.

Aspect 18

In another aspect of the invention, the robot may employ a configuration in which a portion of the housing, to which the amplifier section can be attached, is a heat dissipating member.

With this configuration, in the robot, the portion of the housing, to which the amplifier section can be attached, is the heat dissipating member. Thus, in the robot, it is possible, by the portion of the housing to which the amplifier section can be attached and which is the heat dissipating member, to more reliably prevent the occurrence of trouble due to heat generated by the amplifier section.

Aspect 19

In another aspect of the invention, the robot may employ a configuration in which the housing includes a second opening and a portion of the housing, to which the amplifier section can be attached, is a lid member covering at least a portion of the second opening.

With this configuration, in the robot, the housing includes the second opening, and the portion of the housing, to which the amplifier section can be attached, is the lid member covering at least a portion of the second opening. Thus, in the robot, it is possible by the lid member covering at least a portion of the second opening to more reliably prevent the occurrence of trouble due to heat generated by the amplifier section, and it is also possible to allow the user to easily perform the maintenance of the amplifier section.

Aspect 20

In another aspect of the invention, the robot may employ a configuration in which the material of the lid member is metal.

With this configuration, in the robot, the material of the lid member is metal. Thus, in the robot, it is possible by the lid member of metal to prevent the occurrence of trouble due to heat generated by the amplifier section.

With the configurations described above, in the motor unit and the robot, the amplifier section includes the amplifier cover, and the power line for supplying power to the motor is bound to the amplifier cover. Thus, in the motor unit, it is possible to prevent the power line from interfering with other objects.

Aspect 21

One aspect of the invention is directed to a robot including: a base; a first arm provided to the base; a motor that drives the first arm; and an amplifier section including a drive circuit that drives the motor, wherein the amplifier section is provided in the base.

With this configuration, since the amplifier section is provided in the base, the motor and the amplifier section are separately provided. Thus, it is possible to prevent the influence of vibration or heat from the motor on the amplifier section.

Aspect 22

The robot according to Aspect 21 may employ a configuration in which the base includes an opening and a lid member covering at least a portion of the opening and the amplifier section is provided to the lid member.

With this configuration, since the amplifier section is provided to the lid member, the amplifier section can be taken out from within the base by removing the lid member from the opening. Thus, since access to the amplifier section is facilitated, it is possible to provide the robot having excellent maintainability.

Aspect 23

The robot according to Aspect 22 may employ a configuration in which at least a portion of the motor overlaps an open edge of the opening when viewed in an opening direction of the opening.

With this configuration, in the robot, at least a portion of the motor overlaps the open edge of the opening when viewed in the opening direction. Thus, since the distance between the amplifier section and the motor can be reduced, a wire connecting the amplifier section with the motor can be shortened.

Aspect 24

The robot according to Aspect 22 or 23 may employ a configuration in which a heat dissipating sheet is provided in at least a portion of a space between the amplifier section and the lid member.

With this configuration, it is possible to prevent the occurrence of trouble due to heat generated by the amplifier section.

Aspect 25

The robot according to any of Aspects 22 to 24 may employ a configuration in which a thermal conductivity of the lid member is 40 W/m·K or more.

With this configuration, since the robot includes the lid member having a thermal conductivity of 40 W/m·K or more, it is possible to prevent the occurrence of trouble due to heat generated by the amplifier section.

Aspect 26

The robot according to Aspect 25 may employ a configuration in which a thermal conductivity of the lid member is 200 W/m·K or more.

With this configuration, since the robot includes the lid member having a thermal conductivity of 200 W/m·K or more, it is possible to prevent the occurrence of trouble due to heat generated by the amplifier section.

Aspect 27

The robot according to any of Aspects 21 to 26 may employ a configuration in which the robot further includes a second arm provided to the first arm and an amplifier-integrated motor is provided in the second arm.

Aspect 28

In the robot according to Aspect 27, it is preferable that the amplifier-integrated motor rotates the second arm.

With these configurations, in the robot, the entire configuration can be reduced in size by using the amplifier-integrated motor for the second arm.

As described above, according to the robot according to the aspect of the invention, since the amplifier section is provided in the base, the motor and the amplifier section are separately provided. Thus, in the robot according to the aspect of the invention, it is possible to prevent the influence of vibration or heat from the motor on the amplifier section.

Aspect 29

A robot as one aspect of the invention includes: an arm rotatable around a rotation axis; a motor provided in the arm; and an amplifier section provided to at least one of the arm and the motor and including an amplifier board that drives the motor, wherein when a longitudinal direction of the arm is defined as a first direction and a direction orthogonal to the first direction is defined as a second direction as viewed in an axial direction of the rotation axis, a shortest distance in the second direction between an outer edge of the arm and the motor is shorter than the length of the amplifier section in a normal direction of the amplifier board.

According to this configuration, the dimension of the arm along the second direction can be reduced by making the shortest distance in the second direction between the outer edge of the arm and the motor shorter than the length of the amplifier section.

Aspect 30

The robot according to Aspect 29 may employ a configuration in which a longest distance in the second direction between the outer edge of the arm and the motor is shorter than the length of the amplifier section in the normal direction of the amplifier board.

According to this configuration, the amplifier section is not disposed in the transverse direction (second direction) of the arm with respect to the motor, so that the dimension of the arm along the second direction can be reduced.

Aspect 31

A robot as one aspect of the invention includes: an arm rotatable around a rotation axis; a plurality of motors provided in the arm; and amplifier sections each provided to the motor and including an amplifier board that drives the motor, wherein when a longitudinal direction of the arm is defined as a first direction and a direction orthogonal to the first direction is defined as a second direction as viewed in an axial direction of the rotation axis, the plurality of motors are disposed to be arranged in the second direction, and a shortest distance in the second direction between an outer edge of the arm and the motor and a shortest distance in the second direction between the plurality of motors are shorter than the length of the amplifier section in a normal direction of the amplifier board.

According to this configuration, the dimension of the arm along the second direction can be reduced by making the shortest distance in the second direction between the outer edge of the arm and the motor shorter than the length of the amplifier section.

Aspect 32

The robot according to Aspect 31 may employ a configuration in which when a pair of the motors located at both ends in the second direction, in the plurality of motors disposed to be arranged in the second direction, are defined as a first motor and a second motor, a longest distance in the second direction between the first motor and an outer edge of the arm on the side opposite to the second motor with respect to the first motor, a longest distance in the second direction between the second motor and an outer edge of the arm on the side opposite to the first motor with respect to the second motor, and a longest distance in the second direction between the plurality of motors are shorter than the length of the amplifier section in the normal direction of the amplifier board.

According to this configuration, the amplifier section is not disposed in the transverse direction (second direction) of the arm with respect to the motor, so that the dimension of the arm along the second direction can be reduced.

Aspect 33

The robot according to any of Aspects 29 to 32 may employ a configuration in which the amplifier section is provided to the motor.

According to this configuration, the amplifier section and the motor are integrally configured, and the assembly process of the arm can be simplified.

Aspect 34

A robot as one aspect of the invention includes: an arm rotatable around a rotation axis; a motor provided in the arm; and an amplifier section including an amplifier board that drives the motor and provided to the motor, wherein when a longitudinal direction of the arm is defined as a first direction and a direction orthogonal to the first direction is defined as a second direction as viewed in an axial direction of the rotation axis, the amplifier section is disposed in a direction different from the second direction with respect to the motor.

According to this configuration, the amplifier section is not disposed in the transverse direction (second direction) of the arm with respect to the motor, so that the dimension of the arm along the second direction can be reduced.

Aspect 35

The robot according to any of Aspects 29 to 34 may employ a configuration in which the motor and the amplifier section are disposed along the first direction.

According to this configuration, the motor and the amplifier section can be disposed to be arranged in the longitudinal direction (first direction) in which more space is relatively likely to be available inside the arm. Thus, the space inside the arm can be effectively utilized.

Aspect 36

The robot according to Aspect 35 may employ a configuration in which the motor is disposed in a position closer to the rotation axis than the amplifier section.

According to this configuration, the motor having a large weight can be disposed on the rotation axis side, so that the moment of inertia of the arm can be reduced.

Aspect 37

The robot according to any of Aspects 29 to 36 may employ a configuration in which the arm includes a wedge-shaped portion where the width thereof along the second direction narrows as the distance from the rotation axis increases along the first direction when viewed in the axial direction of the rotation axis.

According to this configuration, the projected area of the arm in a plan view can be reduced, and as a result, the range of movement of the arm can be widened.

Aspect 38

The robot according to any of Aspects 29 to 37 may employ a configuration in which the normal direction of the amplifier board is non-parallel to the first direction.

According to this configuration, the amplifier board can be freely disposed inside the arm.

Aspect 39

The robot according to any of Aspects 29 to 37 may employ a configuration in which an angle formed by the normal direction of the amplifier board and the first direction is 0° or more and 45° or less.

According to this configuration, the amplifier section can be disposed along the longitudinal direction (first direction) with respect to the motor, so that the dimension of the arm in the transverse direction (second direction) can be reduced.

Aspect 40

The robot according to Aspect 39 may employ a configuration in which the angle formed by the normal direction of the amplifier board and the first direction is 5° or more and 20° or less.

According to this configuration, the amplifier section can be disposed along the longitudinal direction (first direction) with respect to the motor, so that the dimension of the arm in the transverse direction (second direction) can be reduced. In addition, when the width dimensions of the amplifier section and the motor are different, the amplifier section and the motor can be disposed so as to minimize the total dimension of the amplifier section and the motor along the second direction.

Aspect 41

A robot according to one aspect of the invention includes: an arm including an arm main body and rotatable around a rotation axis; a motor provided on the arm main body; and an amplifier section provided on at least one of the arm main body and the motor and including a drive circuit that drives the motor, wherein at least a portion of the amplifier section or the motor is located outside the arm main body when viewed in an axial direction of the rotation axis.

According to this configuration, compared to the case where the amplifier section and the motor are contained inside the arm main body, the flexibility of arrangement of the amplifier section and the motor can be increased, and the arm main body can be made compact. Moreover, the maintainability of the amplifier section or the motor located outside the arm main body can be enhanced. In addition, heat can be efficiently dissipated from the amplifier section or the motor located outside the arm main body.

Aspect 42

The robot according to Aspect 41 may employ a configuration in which at least a portion of the amplifier section is located outside the arm main body when viewed in the axial direction of the rotation axis.

According to this configuration, heat dissipating efficiency of the amplifier section can be increased, and the maintainability of the amplifier section can be made favorable.

Aspect 43

The robot according to Aspect 42 may employ a configuration in which the arm main body is provided with a first opening opened in a direction orthogonal to the rotation axis and at least a portion of the amplifier section is located in the first opening.

According to this configuration, the amplifier section can be exposed to the outside of the arm main body through the first opening.

Aspect 44

The robot according to Aspect 42 or 43 may employ a configuration in which the amplifier section is provided on the motor.

According to this configuration, the amplifier section and the motor are integrally configured, and the assembly process of the arm can be simplified.

Aspect 45

The robot according to Aspect 44 may employ a configuration in which the amplifier section is attachable/detachable with respect to the motor.

According to this configuration, the amplifier section located outside the arm main body can be removed from the motor.

Aspect 46

The robot according to Aspect 45 may employ a configuration in which the amplifier section is removed from the motor by moving the amplifier section in one direction.

According to this configuration, the amplifier section can be easily removed from the motor.

Aspect 47

The robot according to any of Aspects 44 to 46 may employ a configuration in which the amplifier section is provided on the motor with a fixing member and the arm main body includes a second opening opened in the direction orthogonal to the rotation axis along an axis of the fixing member.

According to this configuration, the fixation by the fixing member can be easily released by inserting a tool into the second opening.

Aspect 48

The robot according to any of Aspects 41 to 47 may employ a configuration in which the arm includes an arm cover covering the motor and the amplifier section when viewed in the axial direction of the rotation axis.

According to this configuration, it is possible to prevent the application of a load to the motor and the amplifier section from the outside.

Aspect 49

The robot according to Aspect 48 may employ a configuration in which a gap is provided between the arm cover and the arm main body.

According to this configuration, a gap can be formed directly below the amplifier section or the motor located outside the arm main body, so that heat can be effectively dissipated from the amplifier section or the motor.

Aspect 50

A motor unit according to one aspect of the invention includes: a first motor; and a first amplifier section including a drive circuit that drives the first motor, wherein the first motor includes a first attachment/detachment portion that allows the first amplifier section to be attachable/detachable in a first position and a second attachment/detachment portion that allows the first amplifier section to be attachable/detachable in a second position different from the first position.

According to this configuration, the amplifier section can be attached to the motor in a plurality of positions. Thus, the flexibility of arrangement of the motor and the amplifier section inside the arm is enhanced, and as a result, the arm can be made compact.

Aspect 51

The motor unit according to Aspect 50 may employ a configuration in which the first position and the second position are located on different surfaces of the surfaces of the motor.

According to this configuration, the amplifier section can be disposed according to a gap inside the arm by disposing the amplifier section on different surfaces of the motor.

Aspect 52

The motor unit according to Aspect 50 or 51 may employ a configuration in which a rotating shaft of the first motor is provided between the first position and the second position.

According to this configuration, when a pair of amplifier sections are fixed to the motor, the pair of amplifier sections and the motor can be arrayed in one direction. Thus, the space inside the arm can be effectively utilized by, for example, disposing the pair of amplifier sections and the motor in the longitudinal direction of the arm.

Aspect 53

The motor unit according to any of Aspects 50 to 52 may employ a configuration in which the second attachment/detachment portion allows a second amplifier section including a drive circuit that drives a second motor different from the first motor to be attachable/detachable.

According to this configuration, two amplifier sections can be fixed to one motor. Thus, the flexibility of arrangement of the motor and the amplifier sections inside the arm is enhanced, and as a result, the arm can be made compact.

Aspect 54

A motor unit according to one aspect of the invention includes: a first motor; and a first amplifier section including a drive circuit that drives the first motor, wherein the first motor includes a first attachment/detachment portion that allows the first amplifier section to be attachable/detachable, and the first amplifier section includes a third attachment/detachment portion that allows a second amplifier section including a drive circuit that drives a second motor different from the first motor to be attachable/detachable.

According to this configuration, a plurality of amplifier sections can be fixed to one motor so as to be stacked together. Thus, the flexibility of arrangement of the motor and the amplifier sections inside the arm is enhanced, and as a result, the arm can be made compact.

Aspect 55

The motor unit according to any of Aspects 50 to 54 may employ a configuration in which an intervening member intervenes between the attachment/detachment portion and the amplifier section.

According to this configuration, the position and attitude of the amplifier section with respect to the motor can be adjusted by the intervening member, the flexibility of arrangement of the motor and the amplifier section inside the arm is enhanced, and as a result, the arm can be made compact.

Aspect 56

A robot according to one aspect of the invention includes: the motor unit according to Aspect 53 or 54; an arm rotatable around a rotation axis; and an actuating shaft body provided in the arm and rotating around an actuation axis, wherein anyone of the first motor and the second motor rotates the arm around the rotation axis, and the other drives the actuating shaft body.

According to this configuration, two amplifier sections are fixed to one motor, so that the flexibility of arrangement of the motor and the amplifier sections inside the arm is enhanced, and as a result, it is possible to provide the robot in which the arm is made compact.

BRIEF DESCRIPTION OF THE DRAWINGS

The invention will be described with reference to the accompanying drawings, wherein like numbers reference like elements.

DESCRIPTION OF EXEMPLARY EMBODIMENTS

Figure 1:
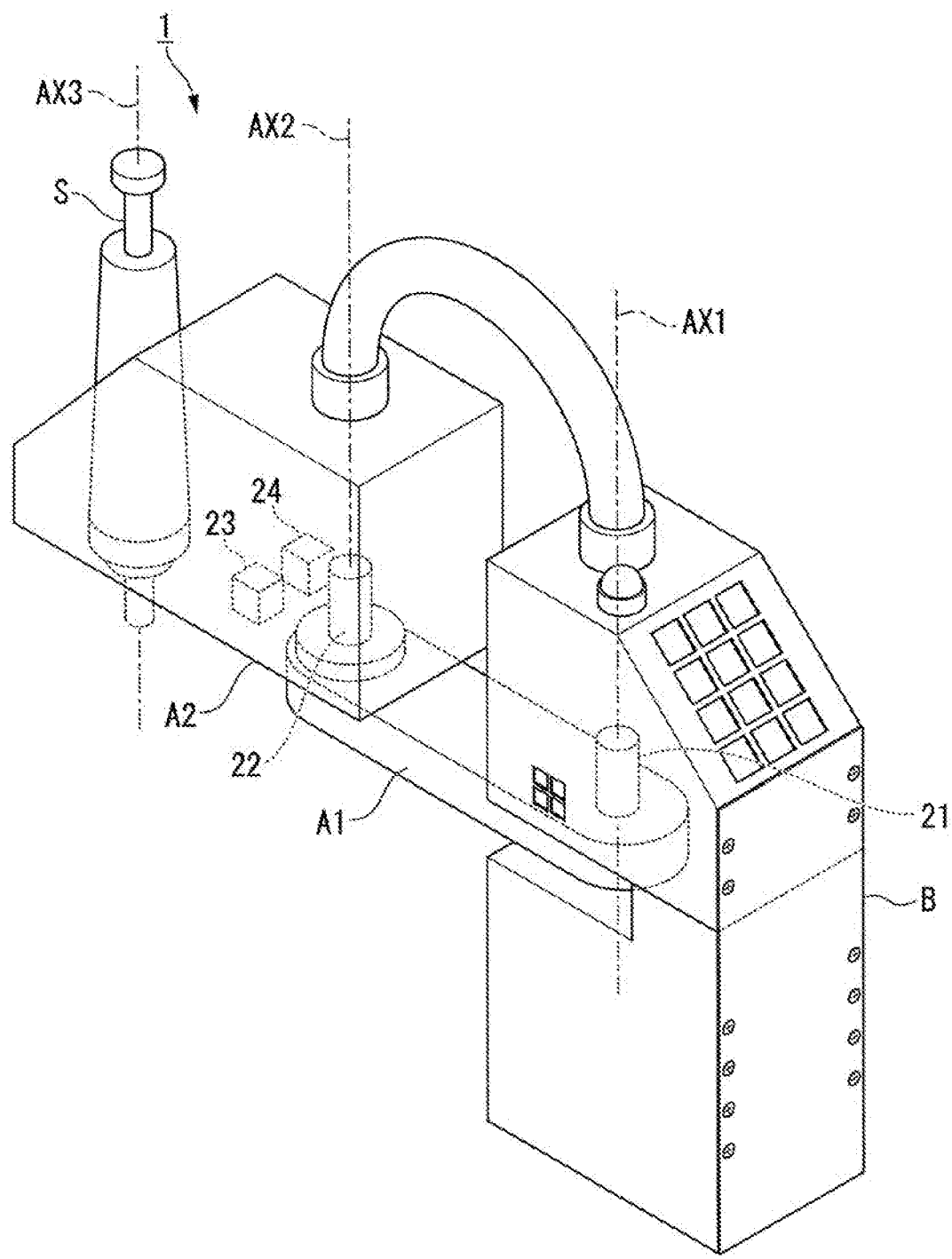
FIG. 1 shows one example of the configuration of a robot according to a first embodiment.

Hereinafter, embodiments of the invention will be described with reference to the drawings.

In the drawings used in the description, a characteristic portion may be shown in an enlarged manner for convenience for clarity of the characteristic, and thus the dimension ratio and the like of each component are not always the same as actual ones.

First Embodiment

Configuration of Robot

First, the configuration of a robot 1 will be described.

FIG. 1 shows one example of the configuration of the robot 1 according to a first embodiment. The robot 1 is a SCARA robot including a support base B installed on an installation surface such as a floor surface or a wall surface, a first arm A1 rotatably supported by the support base B around a first axis AX1, a second arm A2 rotatably supported by the first arm A1 around a second axis AX2, and a shaft S supported by the second arm A2 rotatably around a third axis AX3 and translatably in the axial direction of the third axis AX3.

The robot 1 may be other robots such as a vertical articulated robot or a Cartesian-coordinate robot instead of a SCARA robot. The vertical articulated robot may be a single-arm robot including one arm, may be a dual-arm robot including two arms (a multi-arm robot including two arms), or a multi-arm robot including three or more arms. The Cartesian-coordinate robot is, for example, a gantry robot.

The shaft S is a columnar-shaped shaft body. A ball screw groove and a spline groove (both not shown) are formed on the circumferential surface of the shaft S. In this example, the shaft S is provided to penetrate one of the ends of the second arm A2 that is located on the side opposite to the first arm A1, in a first direction that is a direction vertical to the installation surface on which the support base (base) B is installed. An end effector can be attached to one of the ends of the shaft S that is located on the installation surface side. The end effector may be an end effector that can grasp an object, may be an end effector that can suction an object using air, magnetism, or the like, or may be other end effectors.

In this example, the first arm A1 rotates around the first axis AX1 and therefore moves in a second direction. The second direction is a direction orthogonal to the first direction described above. The second direction is, for example, a direction along the X-Y plane in a world coordinate system or a robot coordinate system RC. The first arm A1 is rotated around the first axis AX1 by a motor unit 21 included in the support base B.

In this example, the second arm A2 rotates around the second axis AX2 and therefore moves in the second direction. The second arm A2 is rotated around the second axis AX2 by a motor unit 22 included in the second arm A2. Moreover, the second arm A2 includes a motor unit 23 and a motor unit 24, and supports the shaft S. The motor unit 23 rotates a ball screw nut provided on the outer circumferential portion of the ball screw groove of the shaft S with a timing belt or the like to thereby move (raise or lower) the shaft S in the first direction. The motor unit 24 rotates a ball spline nut provided on the outer circumferential portion of the spline groove of the shaft S with a timing belt or the like to thereby rotate the shaft S around the third axis AX3.

In the following, the case where the motor unit 21 to the motor unit 24 all have the same configuration will be described as one example. A portion or all of the motor unit 21 to the motor unit 24 may be motor units having different configurations from each other. In the following description, the motor unit 21 to the motor unit 24 are collectively referred to as "motor unit 2" unless they have to be differentiated from each other.

Figure 2:
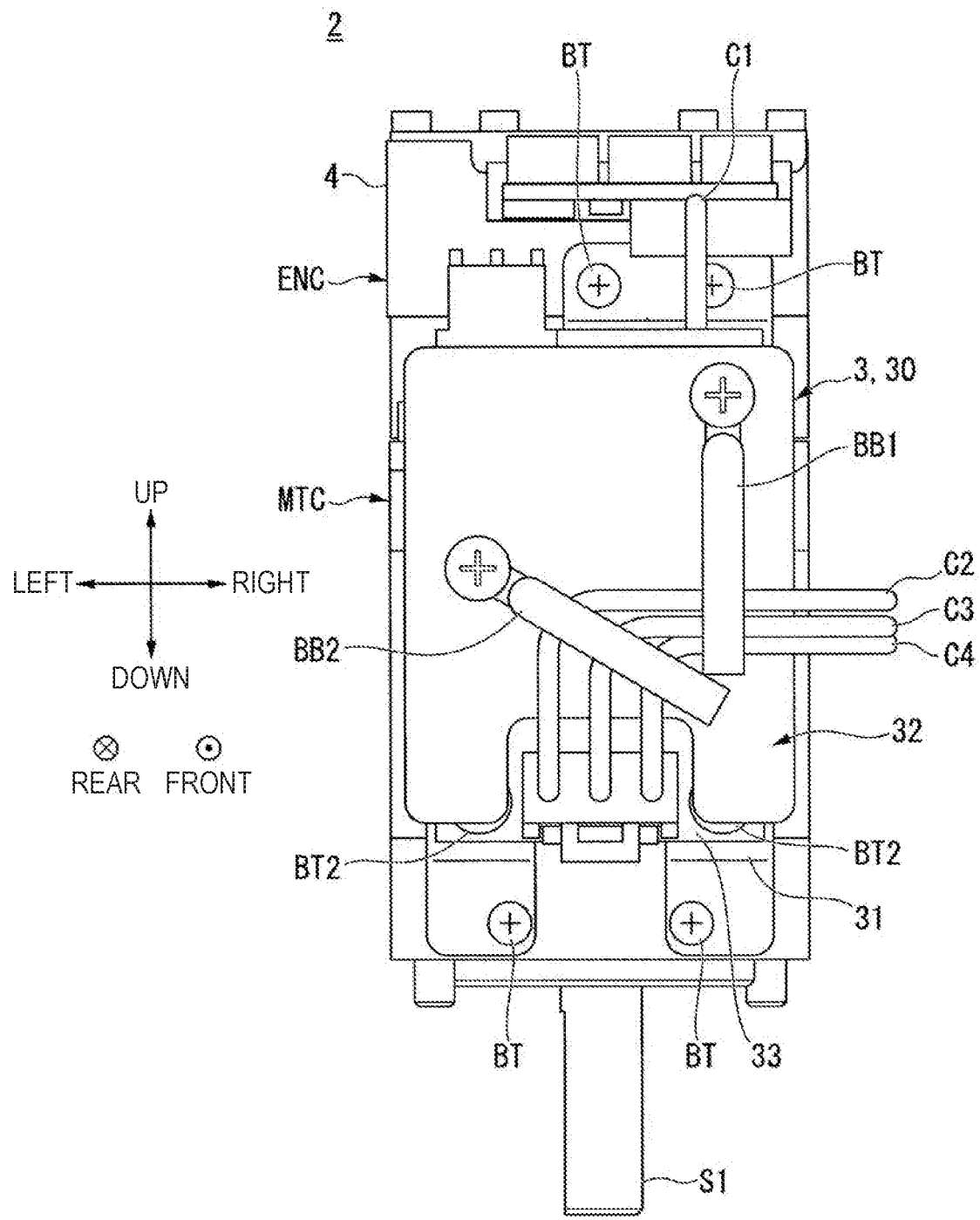
FIG. 2 is a front view showing one example of a motor unit.
Figure 3:
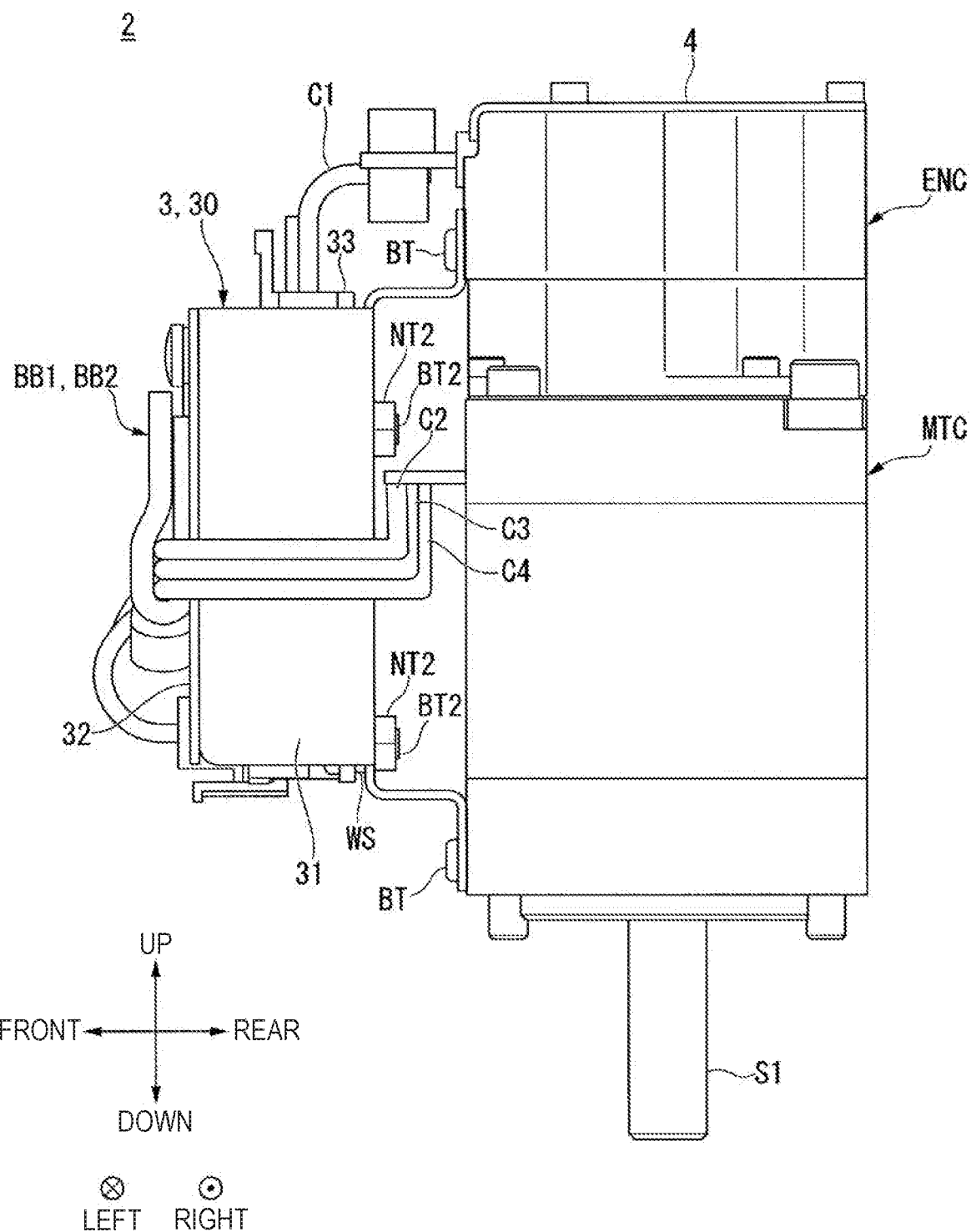
FIG. 3 is a right view of the motor unit shown in FIG. 2.

The motor unit 2 includes a motor 4 and an amplifier section 3 (see FIGS. 2 and 3). The amplifier section 3 includes a drive circuit that drives the motor 4, a control circuit that controls the drive circuit, and a communication circuit. Here, an overview of the motor unit 2 will be described. The motor unit 2 includes the motor 4 and the amplifier section 3 including the drive circuit driving the motor 4. The amplifier section 3 includes an amplifier cover 32. Power lines for supplying power to the motor 4 are bound to the amplifier cover 32. Thus, in the motor unit 2, it is possible to prevent the power line from interfering with other objects. In the following, the motor unit 2 will be described in detail. Moreover, in the following, the case where the motor 4 is a motor integrated with an encoder ENC (not shown in FIG. 1) will be described as one example. The motor 4 may be a motor separated from the encoder ENC.

Configuration of Motor Unit

Hereinafter, the configuration of the motor unit 2 will be described with reference to FIGS. 2 to 8. In the following description, in the directions along a rotating shaft S1 of the motor 4, a direction from the side opposite to a motor top case MTC toward the motor top case MTC (i.e., a direction from the motor top case MTC toward the encoder ENC in the directions along the rotating shaft S1 of the motor 4) is referred to as "upward direction", and a direction from the motor top case MTC toward the opposite side (i.e., a direction from the encoder ENC toward the motor top case MTC in the directions along the rotating shaft S1 of the motor 4) is referred to as "downward direction", for convenience of description. The motor top case MTC is a member provided at one of the ends of the motor 4 that is located on the side opposite to the side where the rotating shaft S1 of the motor 4 projects. Here, the encoder ENC described above is provided at one of the ends of the motor top case MTC that is located on the side opposite to the side where the rotating shaft S1 of the motor 4 projects. In the following description, in the side surfaces (surfaces parallel to the up-and-down direction) of the motor 4, a surface to which the amplifier section 3 is attached is referred to as "front surface", a surface opposed to the front surface is referred to as "rear surface", a surface located on the right side when the motor 4 is viewed facing the front surface is referred to as "right surface", and a surface opposed to the right surface is referred to as "left surface".

Figure 4:
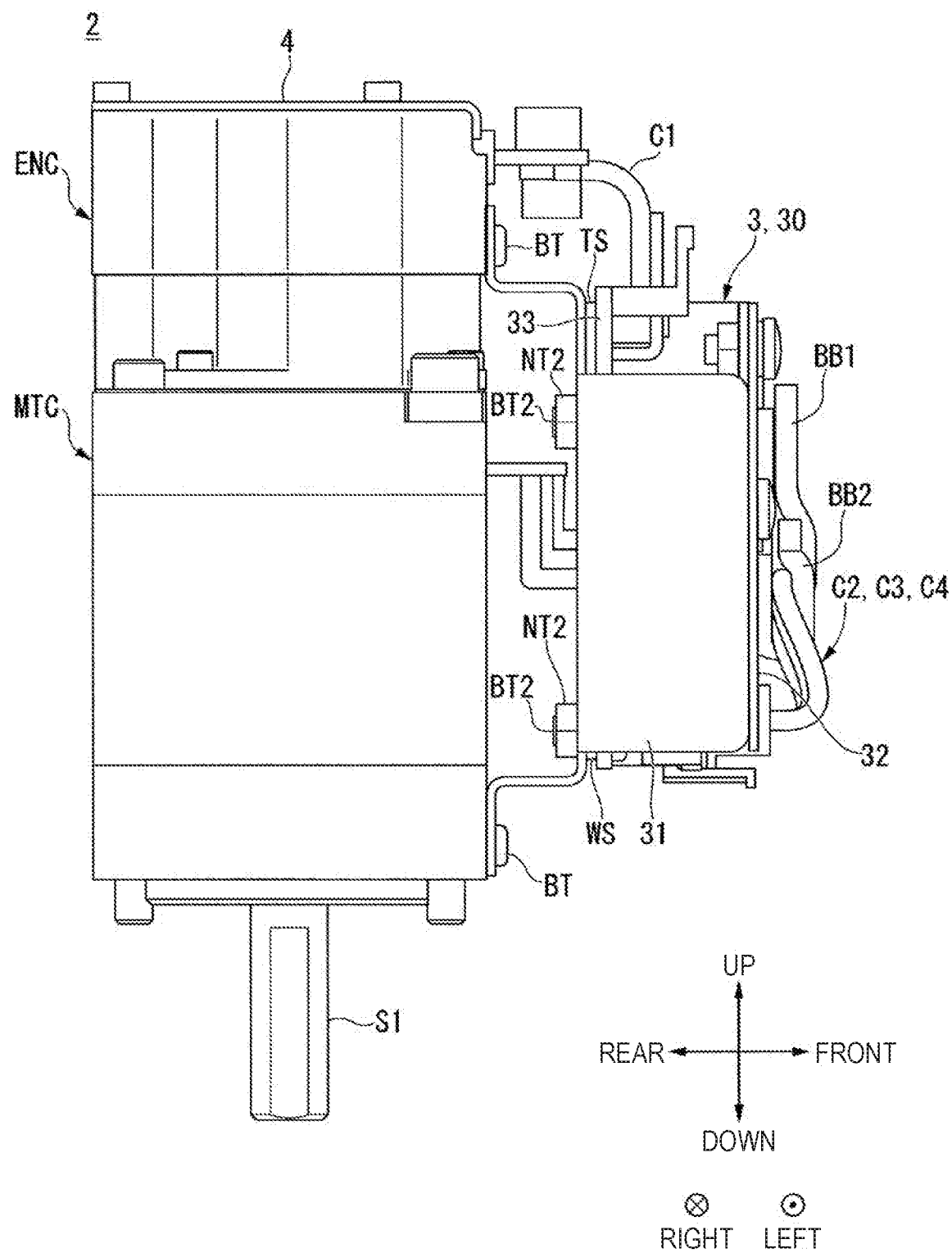
FIG. 4 is a left view of the motor unit shown in FIG. 2.
Figure 5:
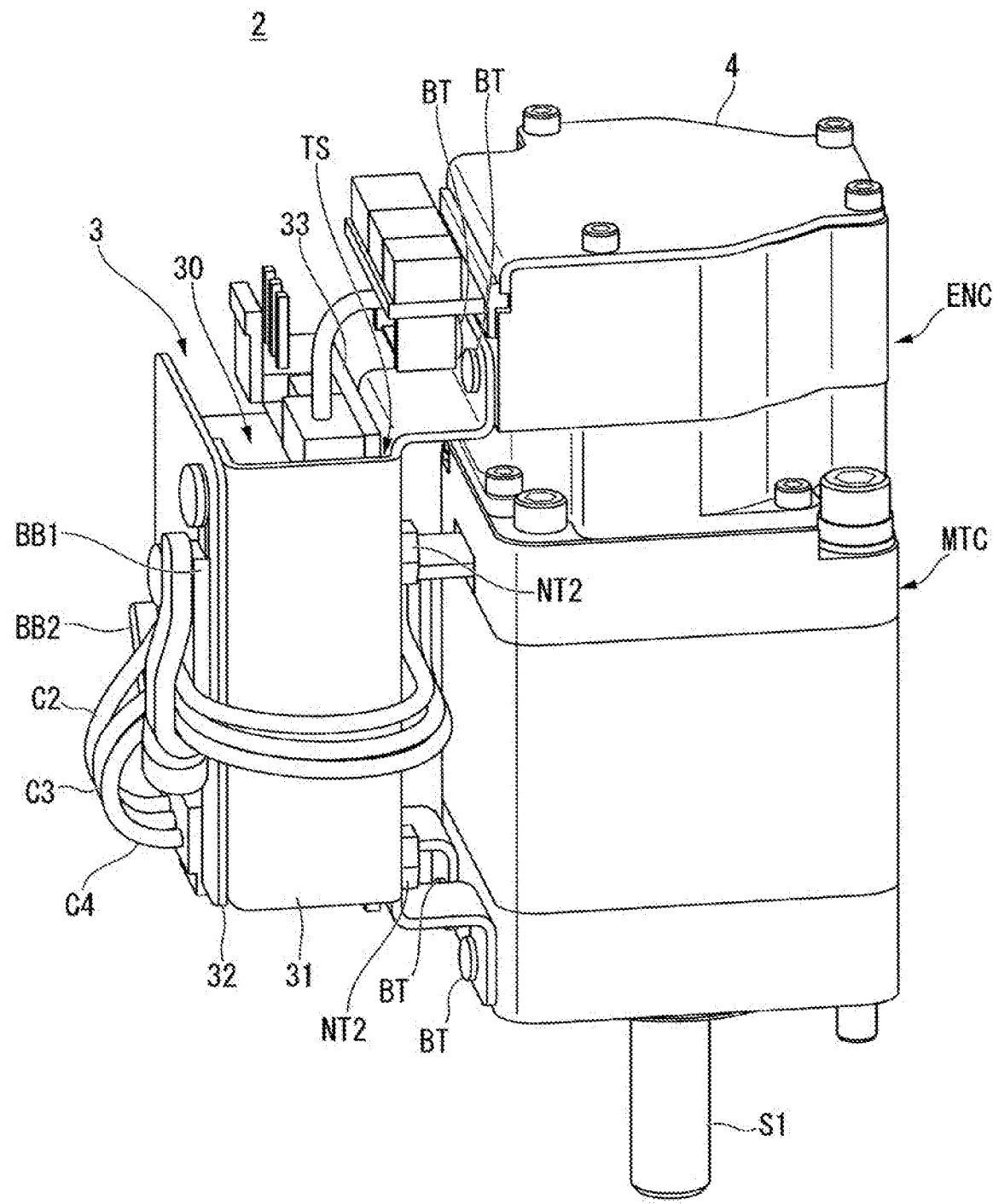
FIG. 5 is a perspective view of the motor unit shown in FIG. 2.
Figure 6:
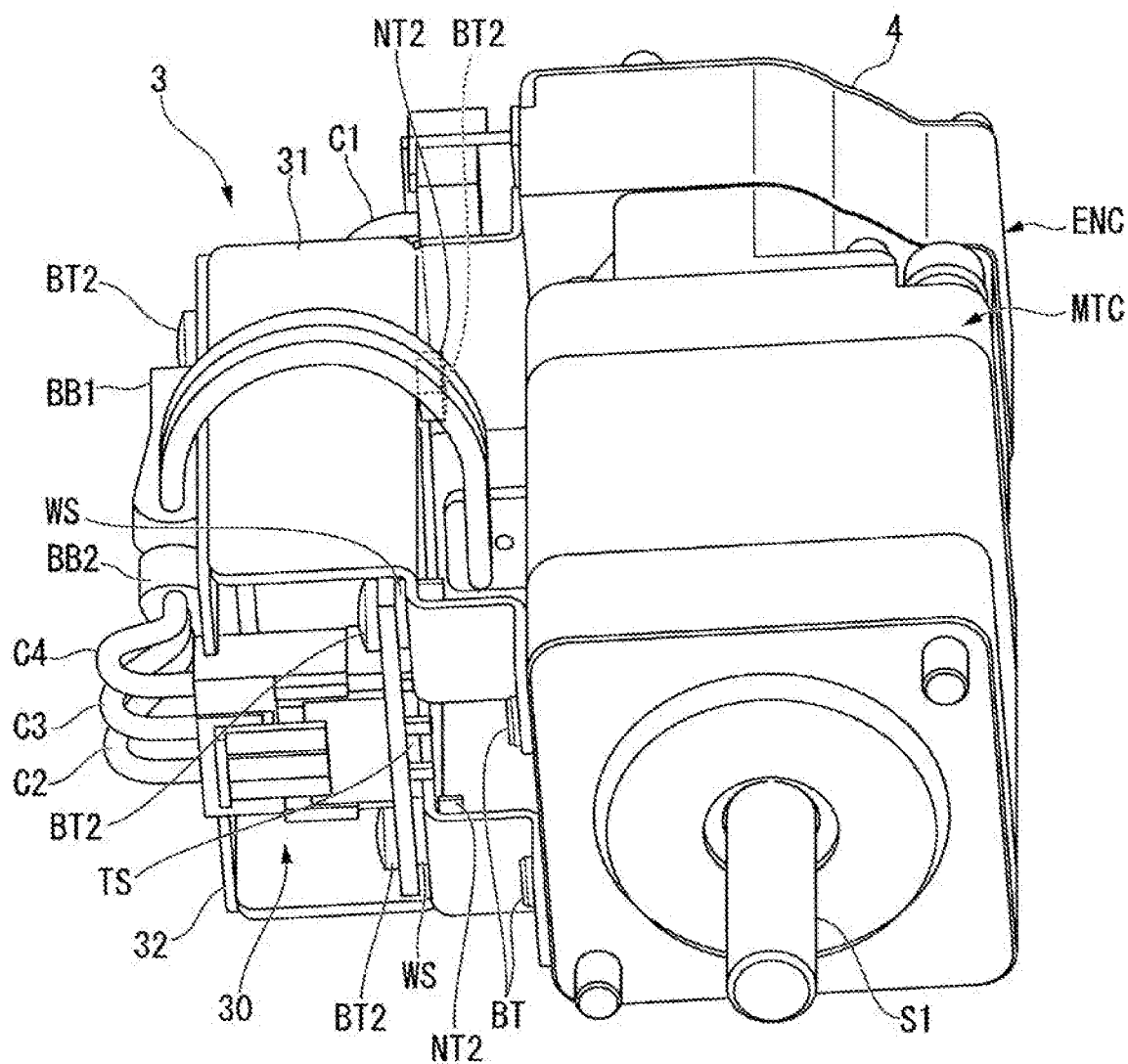
FIG. 6 is a perspective view of the motor unit shown in FIG. 5 when viewed at another angle.
Figure 7:
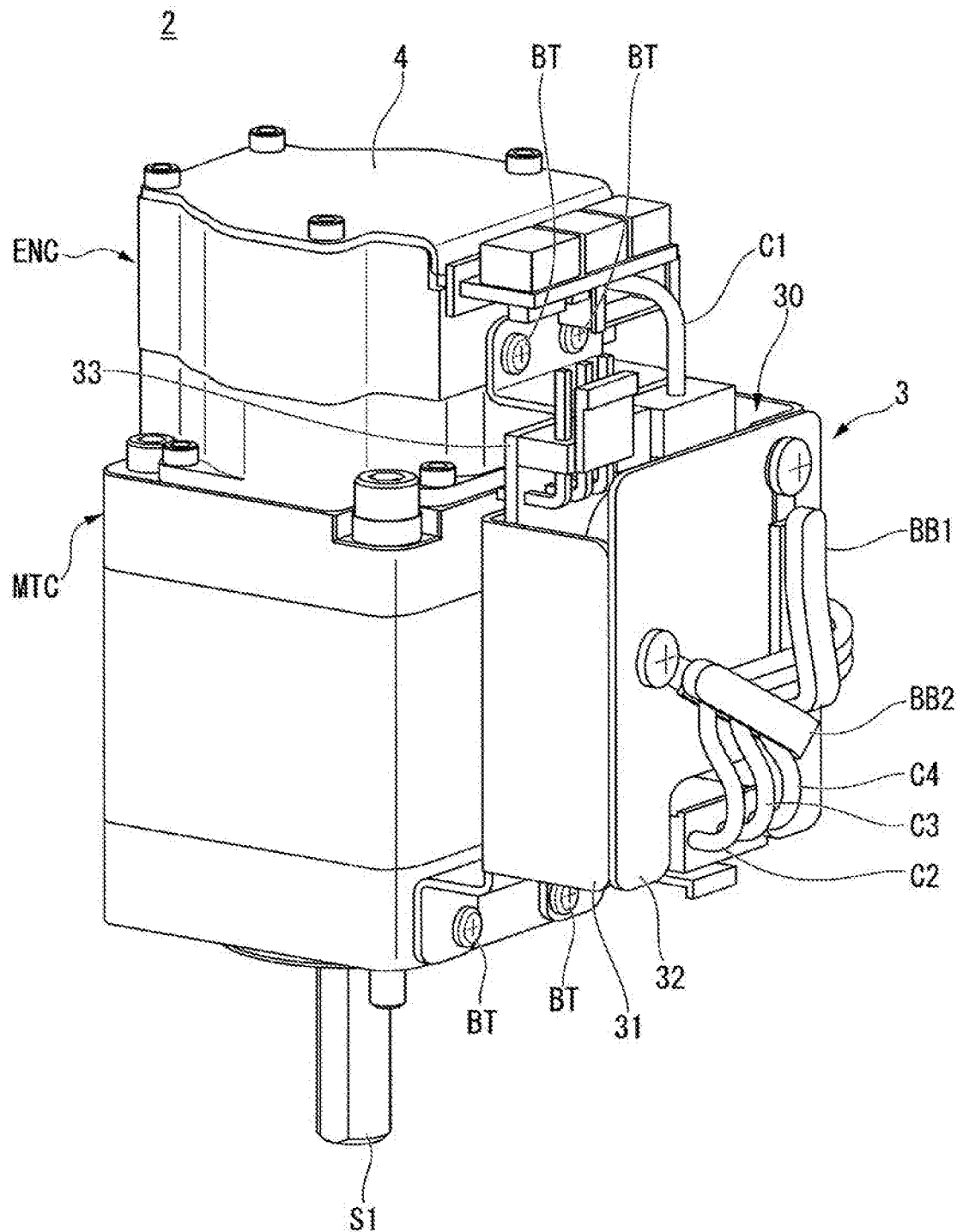
FIG. 7 is a perspective view of the motor unit shown in FIG. 5 when viewed at still another angle.
Figure 8:
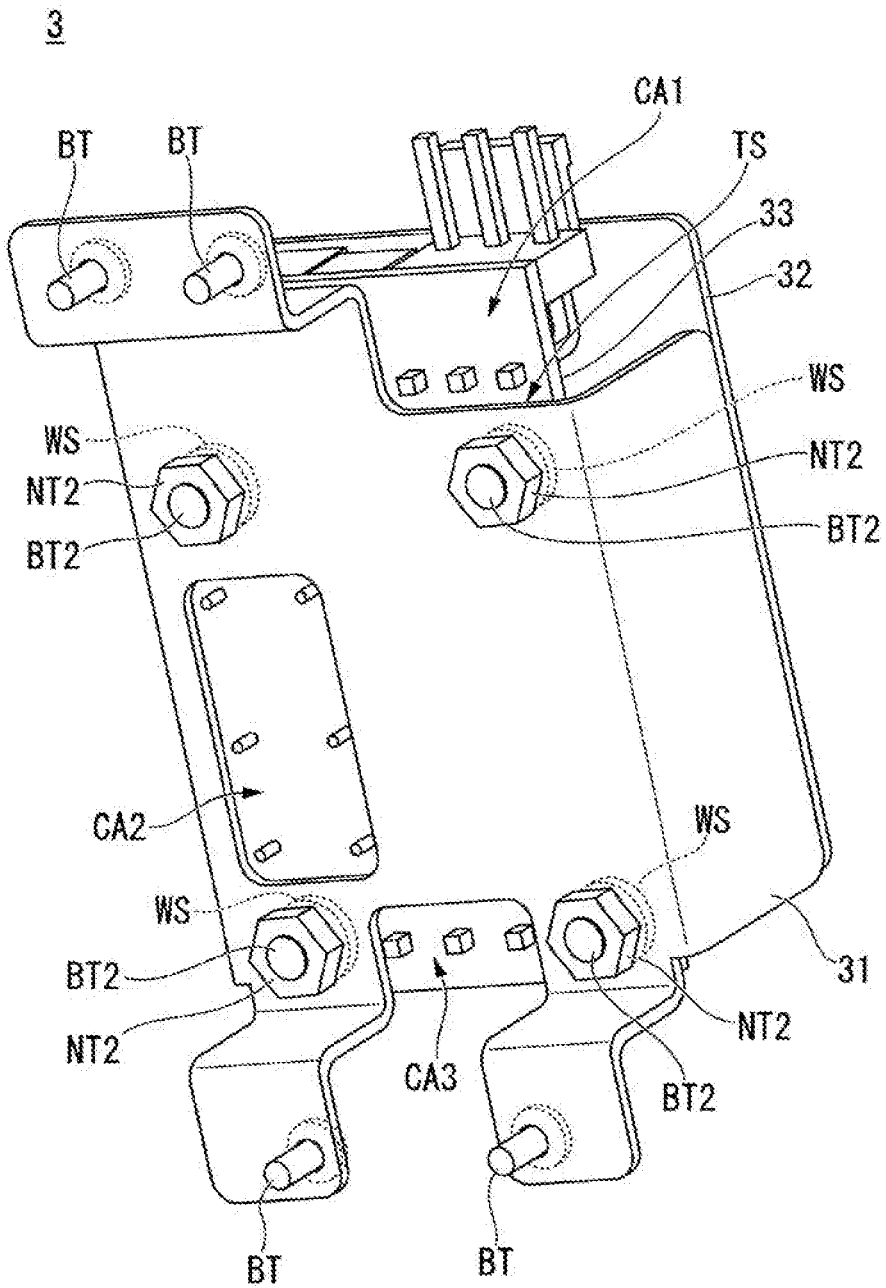
FIG. 8 is a perspective view showing one example of an amplifier section included in the motor unit.

FIG. 2 is a front view showing one example of the motor unit 2. FIG. 3 is a right view of the motor unit 2 shown in FIG. 2. FIG. 4 is a left view of the motor unit 2 shown in FIG. 2. FIG. 5 is a perspective view of the motor unit 2 shown in FIG. 2. FIG. 6 is a perspective view of the motor unit 2 shown in FIG. 5 when viewed at another angle. FIG. 7 is a perspective view of the motor unit 2 shown in FIG. 5 when viewed at still another angle. FIG. 8 is a perspective view showing one example of the amplifier section 3 included in the motor unit 2.

As shown in FIGS. 2 to 7, the amplifier section 3 is attached to the front surface of the motor 4 in the motor unit 2. In the following, the case where the motor 4 is a three-phase DC motor will be described as one example. Instead of the three-phase DC motor, the motor 4 may be other motors. The amplifier section 3 amplifies power supplied via a board included in the motor 4, and causes the motor 4 to operate in response to a control signal supplied via the board. Specifically, when causing the motor 4 to operate, the amplifier section 3 supplies the power to respective electromagnets of three phases included in the motor 4 at the timing in response to the control signal. In the following description, the three phases are respectively referred to as "U-phase", "V-phase", and "W-phase" for convenience of description.

The amplifier section 3 supplies power to the U-phase electromagnet of the motor 4 through the power line C2. That is, the power line C2 is a power line that connects the amplifier section 3 with the U-phase electromagnet of the motor 4. Moreover, the amplifier section 3 supplies power to the V-phase electromagnet of the motor 4 through the power line C3. That is, the power line C3 is a power line that connects the amplifier section 3 with the V-phase electromagnet of the motor 4. Moreover, the amplifier section 3 supplies power to the W-phase electromagnet of the motor 4 through the power line C4. That is, the power line C4 is a power line that connects the amplifier section 3 with the W-phase electromagnet of the motor 4.

The amplifier section 3 is supplied with power from the board included in the motor 4 through a power line passing through a pipe C1. The board is supplied with power from a power source (not shown), and supplies the supplied power to the amplifier section 3 through the power line. The amplifier section 3 is supplied with the control signal from the board included in the motor 4 through a communication line passing through the pipe C1. The board is supplied with the control signal from a robot controller (not shown), and supplies the supplied control signal to the amplifier section 3 through the communication line. The robot controller is a device that controls the robot 1.

The amplifier section 3 has a structure in which an amplifier board 33 is accommodated in an accommodating portion 30. The amplifier board 33 is a board including the drive circuit, the control circuit, and the communication circuit described above. In this example, the accommodating portion 30 includes a heat dissipating member 31 constituting a rear partition wall portion (including an attachment portion) of the accommodating portion 30, a left partition wall portion of the accommodating portion 30, and a right partition wall portion of the accommodating portion 30, and the amplifier cover 32 fixed to the heat dissipating member 31, but does not include an upper partition wall portion and a lower partition wall portion. The amplifier board 33 is disposed in (fixed to) the accommodating portion 30 at the rear partition wall portion of the accommodating portion 30. Since the accommodating portion 30 does not include the upper partition wall portion and the lower partition wall portion, the accommodating portion 30 can dissipate the heat (i.e., the heat of the amplifier board 33) of the amplifier section 3 with the air passing through the accommodating portion 30.

The heat dissipating member 31 is a heat dissipating member having a predetermined thermal conductivity corresponding to the amount of heat generated by the amplifier section 3, that is, the amount of heat generated by the amplifier board 33. Thus, in the motor unit 2, it is possible to prevent the occurrence of trouble due to heat generated by the amplifier section 3. In the following, the case where the thermal conductivity is 40 W/m·K or more will be described as one example. The thermal conductivity may be less than 40 W/m·K as long as the thermal conductivity is at the value at which it is possible to perform heat dissipation enough to prevent the occurrence of trouble in the amplifier board 33 due to heat generation.

The material of the heat dissipating member 31 is resin or metal such as iron, aluminum, or copper. Resin has a thermal conductivity approximately ranging from 0.5 to 2 W/m·K. Iron has a thermal conductivity approximately ranging from 40 to 60 W/m·K. Aluminum has a thermal conductivity of approximately 200 W/m·K. Copper has a thermal conductivity approximately ranging from 350 to 400 W/m·K. In the following, the case where the material of the heat dissipating member 31 is aluminum will be described as one example.

The heat dissipating member 31 includes the attachment portion attachable to the front surface of the motor 4 with volts BT. Thus, the motor 4 and the amplifier section 3 can be integrated together in the motor unit 2. Through-holes through which the volts BT penetrate are formed in the attachment portion. In the example shown in FIGS. 2 to 7, the heat dissipating member 31 is attached to the front surface of the motor 4 with the attachment portion and four volts. Instead of the configuration of being attached to the front surface of the motor 4 with the volts BT, the heat dissipating member 31 may be configured to be attached to the front surface of the motor 4 with other attachment jigs, attachment mechanism, or the like, other than the volts BT. Moreover, the heat dissipating member 31 may be configured to be attached to the other surfaces of the motor 4 instead of the front surface of the motor 4.

The amplifier board 33 is disposed (fixed) to the heat dissipating member 31 with volts BT2 and nuts NT2. A cushioning member WS is disposed between the amplifier board 33 and the heat dissipating member 31. The cushioning member WS is a member for preventing the deformation of the amplifier board 33 due to stress caused by tightening of the volts when the amplifier board 33 is disposed to the heat dissipating member 31. The cushioning member WS is, for example, a spring washer. Thus, in the motor unit 2, it is possible to prevent the deformation of the amplifier board 33 when the heat dissipating member 31 is attached to the amplifier board 33. Instead of the spring washer, the cushioning member WS may be other members that prevent the deformation of the amplifier board 33 due to the stress.

A heat dissipating sheet TS is disposed in at least a portion of the space between the amplifier board 33 and the heat dissipating member 31. The thickness (in this example, the thickness in the front-and-rear direction) of the heat dissipating sheet TS is substantially the same as the thickness (in this example, the thickness in the front-and-rear direction) of the cushioning member WS in the state where the amplifier board 33 is disposed to the heat dissipating member 31 with the volts BT2 and the nuts NT2. The portion is a portion between the amplifier board 33 and the heat dissipating member 31 where the temperature rises due to heat generated by the amplifier board 33. The heat dissipating sheet TS is formed so as not to include a portion overlapping the cushioning member WS when the amplifier section 3 is viewed from the front direction toward the rear direction. Thus, in the motor unit 2, the cushioning member WS and the heat dissipating sheet TS can be filled between the amplifier board 33 and the heat dissipating member 31, and it is possible to prevent the occurrence of trouble due to heat generated by the amplifier section 3.

As shown in FIG. 8, an opening CA1, an opening CA2, and an opening CA3 are formed each as a first opening in the heat dissipating member 31. The first opening is a portion (space) of the heat dissipating member 31 that does not cover the amplifier board 33 in the state where the amplifier board 33 is disposed to the heat dissipating member 31 when the amplifier section 3 is viewed from the rear direction toward the front direction. In this example, various kinds of circuits are printed on a portion that is not covered by the heat dissipating member 31 due to the first opening in the rear surface of the amplifier board 33. The portion may be other desired portions that are not desired to be covered by the heat dissipating member 31 in the rear surface of the amplifier board 33.

That is, since the first opening is formed in the heat dissipating member 31, a desired portion of the amplifier section 3 that is not wanted to be covered by the heat dissipating member 31 can be opened to the outside through the first opening in the motor unit 2. Especially in the case where the heat dissipating member 31 is metal, if the portion on which the circuits are printed is covered by the heat dissipating member 31, the heat dissipating member 31 may cause a short circuit in the circuits. In the motor unit 2, since the first opening is formed in the heat dissipating member 31, such a short circuit can be prevented.

The amplifier cover 32 is a cover covering the front surface of the accommodating portion 30. The power line C2, the power line C3, and the power line C4, described above, are bound to the amplifier cover 32. Thus, in the motor unit 2, it is possible to prevent each of the power line C2, the power line C3, and the power line C4 from interfering with other objects. Moreover, in the motor unit 2, it is possible to prevent each of the power line C2, the power line C3, and the power line C4 from being bent exceeding the maximum bend radius, and it is also possible to allow the user to easily assemble the motor unit 2.

Specifically, a first binding portion BB1 and a second binding portion BB2 are attached to the front surface of the amplifier cover 32, that is, to the outside of the amplifier cover 32.

The first binding portion BB1 is a member that binds the power line C2, the power line C3, and the power line C4, which are connected from the amplifier board 33 to the motor 4, at a position relatively farther away from the connection position where the power line C2, the power line C3, and the power line C4 are connected to the amplifier board 33, than the second binding portion BB2. The first binding portion BB1 is, for example, a binding clip. In this example, the first binding portion BB1 is attached to the amplifier cover 32 with a screw.

The second binding portion BB2 is a member that binds the power line C2, the power line C3, and the power line C4, which are connected from the amplifier board 33 to the motor 4, at a position relatively closer to the connection position where the power line C2, the power line C3, and the power line C4 are connected to the motor 4, than the first binding portion BB1. The second binding portion BB2 is, for example, a binding clip. In this example, the second binding portion BB2 is attached to the amplifier cover 32 with a screw.

With the first binding portion BB1 and the second binding portion BB2, the power line C2, the power line C3, and the power line C4 are bound to the outside of the amplifier cover 32. Thus, in the motor unit 2, it is possible to prevent each of the power line C2, the power line C3, and the power line C4, which are bound to the outside of the amplifier board 33, from interfering with other objects. Moreover, in the motor unit 2, it is possible to prevent each of the power line C2, the power line C3, and the power line C4, which are bound to the outside of the amplifier cover, from being bent exceeding the maximum bend radius, and it is also possible to allow the user to easily assemble the motor unit 2.

Here, when another wire is interposed between the amplifier cover 32 and each of the power line C2, the power line C3, and the power line C4, noise may occur in the wire. In the amplifier section 3, therefore, another wire is not interposed between the amplifier cover 32 and each of the power line C2, the power line C3, and the power line C4. Specifically, in the amplifier section 3, in order to prevent another wire from entering between each of the power line C2, the power line C3, and the power line C4 and the amplifier section 3, the power line C2, the power line C3, and the power line C4 are each routed along the surface of the amplifier section 3 and are bound with the first binding portion BB1 and the second binding portion BB2. Thus, in the motor unit 2, it is possible to prevent a change in the waveform of a current flowing through each of the power line C2, the power line C3, and the power line C4 from changing the waveform of a current flowing through another wire (i.e., to prevent the occurrence of noise).

The power line C2, the power line C3, and the power line C4 may be each configured to be bound at other positions of the amplifier cover 32, such as the side surface of the amplifier cover 32, instead of the front surface of the amplifier cover 32. In this case, the positions at which the first binding portion BB1 and the second binding portion BB2 are attached to the amplifier cover 32 are positions at which the power line C2, the power line C3, and the power line C4 are bound and which correspond to the position of the amplifier cover 32. Moreover, the power line C2, the power line C3, and the power line C4 may be each configured to be bound to the inside of the amplifier cover 32 instead of the outside of the amplifier cover 32. In this case, the first binding portion BB1 and the second binding portion BB2 are attached to the inside of the amplifier cover 32.

Figure 9:
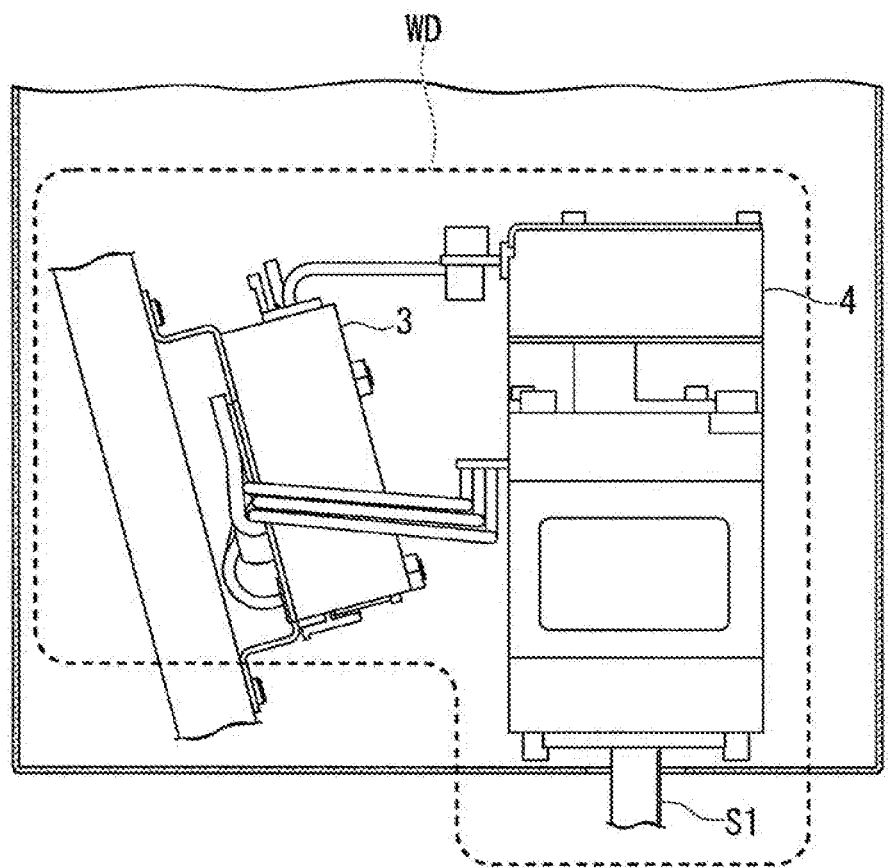
FIG. 9 shows one example of the internal state of a second arm.

The amplifier section 3 described above may be configured to be attachable to an object other than the motor 4 inside the arm (in this example, the first arm A1 or the second arm A2) included in the robot 1 as shown in FIG. 9. FIG. 9 shows one example of the internal state of the second arm. A2. The motor unit 2 contained in the dotted line WD shown in FIG. 9 includes the motor 4 and the amplifier section 3 separately provided, and the amplifier section 3 is attached to a member inside the second arm A2, as an object other than the motor 4. Since the amplifier section 3 is attachable to an object other than the motor 4 as described above, it is possible to improve flexibility in selecting a position for assembling to an assembly object in the motor unit 2.

Moreover, the amplifier section 3 described above may be configured to be attachable to a housing included in the robot 1, as an object other than the motor 4. The housing included in the robot 1 is, for example, a housing of the support base B or a housing of the second arm A2. Thus, in the robot 1, it is possible to dissipate the heat of the amplifier board 33 through heat conduction from the heat dissipating member 31 to these housings. That is, in the robot 1, it is possible by these housings to prevent the occurrence of trouble due to heat generated by the amplifier section 3.

Further, when the amplifier section 3 is attached to the housing of the second arm A2, the housing is movable with the rotation of the second arm A2, and therefore, the housing can more quickly dissipate the heat of the amplifier board 33, which is conducted from the heat dissipating member 31, with wind (air). That is, in the robot 1, it is possible by the movable housing to more reliably prevent the occurrence of trouble due to heat generated by the amplifier section 3.

Here, a portion of the housing included in the robot 1, to which at least the amplifier section 3 is attachable, may be the heat dissipating member 31. Thus, in the robot 1, it is possible by the portion to more reliably prevent the occurrence of trouble due to heat generated by the amplifier section 3.

Moreover, the heat dissipating member 31 included in the amplifier section 3 may be configured to be formed integrally with the housing included in the robot 1. In this case, a portion serving as the rear partition wall portion of the accommodating portion 30, a portion serving as the left partition wall portion of the accommodating portion 30, and a portion serving as the right partition wall portion of the accommodating portion 30 are formed in the housing. In addition, the housing is provided with the amplifier cover 32. Thus, since the heat dissipating member 31 included in the amplifier section 3 can be made common with the housing included in the robot 1, the robot 1 does not require the heat dissipating member 31 provided separately from the housing, can be produced at low cost, and can be reduced in size. Moreover, since the housing and the heat dissipating member 31 are formed integrally together and thus joints between the members are not present, the heat of the amplifier section 3 can be efficiently dissipated in the robot 1.

Figure 10:
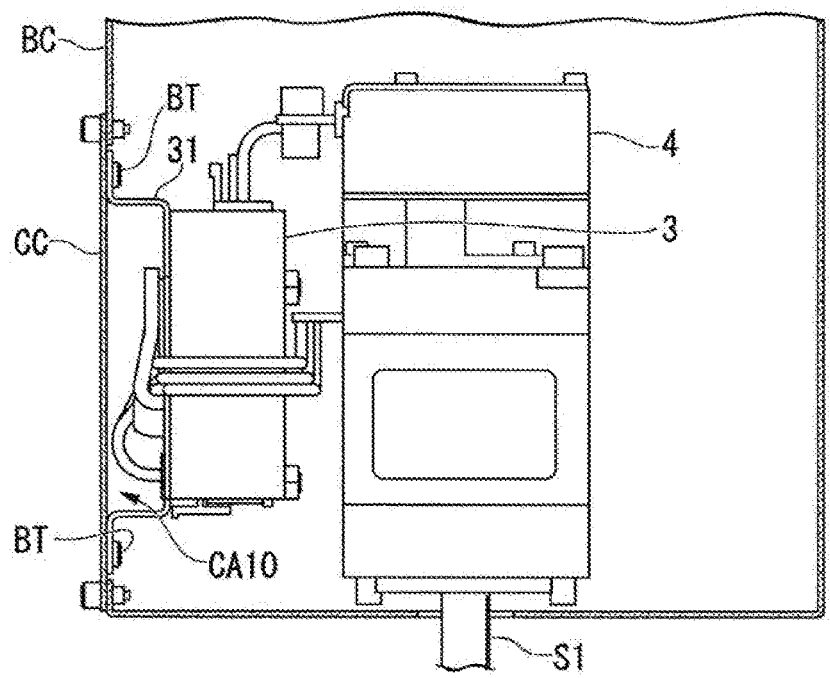
FIG. 10 shows one example of the amplifier section attached to a lid member covering at least a portion of a housing that is included in the robot and includes a second opening.
Figure 11:
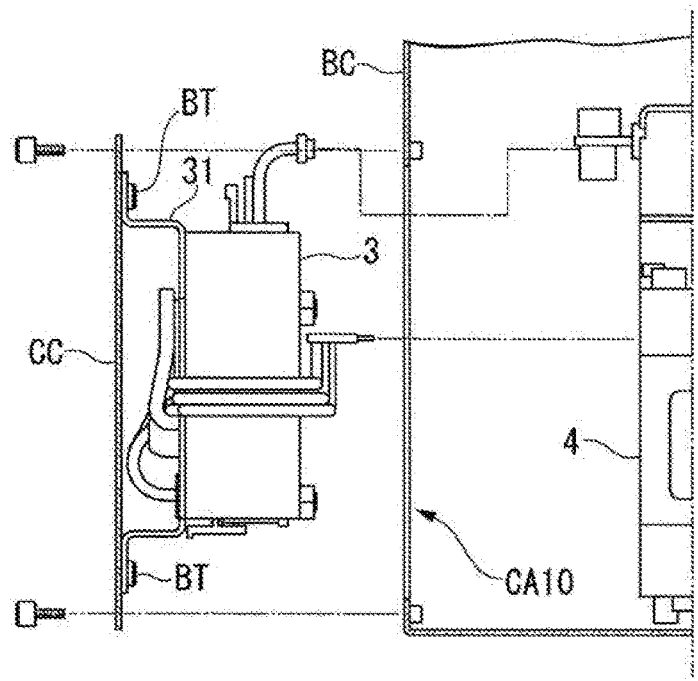
FIG. 11 shows the state where the lid member is removed from the housing shown in FIG. 10.

When the housing included in the robot 1 includes a second opening, the amplifier section 3 may be configured to be attached to a lid member covering at least a portion of the second opening as shown in FIGS. 10 and 11. A lid member CC shown in FIGS. 10 and 11 is one example of the lid member. That is, the lid member is a portion of the housing, to which the amplifier section 3 is attachable. FIG. 10 shows one example of the amplifier section 3 attached to the lid member CC covering at least a portion of a housing BC that is included in the robot 1 and includes a second opening CA10. FIG. 11 shows the state where the lid member CC is removed from the housing BC shown in FIG. 10. The housing BC shown in FIGS. 10 and 11 is one example of the housing included in the robot 1. The housing BC includes the second opening CA10.

In the example shown in FIGS. 10 and 11, the lid member CC is attached to the housing BC so as to cover the whole of the second opening CA10 from the outside of the housing BC. In the example, the amplifier section 3 is attached to a surface of the surfaces of the second opening CA10 that is located inside the housing BC. Thus, in the motor unit 2, it is possible by the lid member CC covering at least a portion of the second opening CA10 to more reliably prevent the occurrence of trouble due to heat generated by the amplifier section 3. Moreover, when the amplifier section 3 is attached to the lid member CC as shown in FIGS. 10 and 11, the user can easily take out the amplifier section 3 to the outside of the housing BC by removing the lid member CC without removing the motor 4. As a result, the motor unit 2 allows the user to easily perform the maintenance of the amplifier section 3.

Here, the heat dissipating member 31 may be configured to be formed integrally with the lid member CC. In this case, a portion serving as the rear partition wall portion of the accommodating portion 30, a portion serving as the left partition wall portion of the accommodating portion 30, and a portion serving as the right partition wall portion of the accommodating portion 30 are formed in the lid member CC. In addition, the lid member CC is provided with the amplifier cover 32. Thus, since the heat dissipating member 31 included in the amplifier section 3 can be made common with the lid member CC included in the robot 1, the robot 1 does not require the heat dissipating member 31 provided separately from the lid member CC, can be produced at low cost, and can be reduced in size. Moreover, since the lid member CC and the heat dissipating member 31 are formed integrally together and thus joints between the members are not present, the heat of the amplifier section 3 can be efficiently dissipated in the robot 1.

Here, when the thermal conductivity of the lid member CC is equal to or more than the thermal conductivity of the heat dissipating member 31, the heat of the amplifier section 3, which is conducted from the heat dissipating member 31, can be efficiently dissipated by the lid member CC in the motor unit 2. In this example, since the thermal conductivity of the heat dissipating member 31 is 40 W/m·K or more, the thermal conductivity of the lid member CC is 40 W/m·K or more. The thermal conductivity of the lid member CC may be less than the thermal conductivity of the heat dissipating member 31.

In the motor unit 2 as described above, an amplifier section (in this example, the amplifier section 3) includes an amplifier cover (in this example, the amplifier cover 32), and a power line (in this example, each of the power line C2, the power line C3, and the power line C4) for supplying power to a motor (in this example, the motor 4) is bound to the amplifier cover. Thus, in the motor unit 2, it is possible to prevent the power line from interfering with other objects.

Moreover, in the motor unit 2, the power line is bound to the outside of the amplifier cover. Thus, in the motor unit 2, it is possible to prevent the power line bound to the outside of the amplifier cover from interfering with other objects.

Moreover, in the motor unit 2, another wire is not interposed between the amplifier cover and the power line. Thus, in the motor unit 2, it is possible to prevent a change in the waveform of a current flowing through the power line from changing the waveform of a current flowing through another wire.

Moreover, the motor unit 2 includes a waterproof cover covering at least one of the motor and the amplifier section. Thus, in the motor unit 2, water resistance can be improved.

Moreover, in the motor unit 2, the amplifier section includes a heat dissipating member (in this example, the heat dissipating member 31) having a predetermined thermal conductivity corresponding to the amount of heat generated by the amplifier section. Thus, in the motor unit 2, it is possible to prevent the occurrence of trouble due to heat generated by the amplifier section.

Moreover, in the motor unit 2, the amplifier section includes a heat dissipating member whose material is metal. Thus, in the motor unit 2, it is possible by the heat dissipating member of metal to prevent the occurrence of trouble due to heat generated by the amplifier section.

Moreover, in the motor unit 2, the amplifier section includes a heat dissipating member whose material is any of iron, aluminum, and copper. Thus, in the motor unit, it is possible by the heat dissipating member whose material is any of iron, aluminum, and copper to prevent the occurrence of trouble due to heat generated by the amplifier section.

Moreover, in the motor unit 2, the amplifier section includes a heat dissipating member having a thermal conductivity of 40 W/m·K or more. Thus, in the motor unit 2, it is possible by the heat dissipating member having a thermal conductivity of 40 W/m·K or more to prevent the occurrence of trouble due to heat generated by the amplifier section.

Moreover, in the motor unit 2, the amplifier section includes a heat dissipating member having a thermal conductivity of 200 W/m·K or more. Thus, in the motor unit 2, it is possible by the heat dissipating member having a thermal conductivity of 200 W/m·K or more to prevent the occurrence of trouble due to heat generated by the amplifier section.

Moreover, in the motor unit 2, the heat dissipating member can attach the amplifier section to the motor. Thus, in the motor unit 2, the motor and the amplifier section can be integrated together.

Moreover, in the motor unit 2, the heat dissipating member can attach the amplifier section to an object (in this example, a housing included in the robot 1) other than the motor. Thus, in the motor unit 2, it is possible to improve flexibility in selecting a position for assembling to an assembly object.

Moreover, in the motor unit 2, the heat dissipating member includes a first opening (in this example, each of the opening CA1, the opening CA2, and the opening CA3). Thus, in the motor unit 2, it is possible to open a desired portion of the amplifier section that is not wanted to be covered by the heat dissipating member to the outside through the first opening.

Moreover, in the motor unit 2, the amplifier section includes an amplifier board (in this example, the amplifier board 33), and a cushioning member (the cushioning member WS) is disposed between the amplifier board and the heat dissipating member. Thus, in the motor unit 2, it is possible to prevent the deformation of the amplifier board when the heat dissipating member is attached to the amplifier board.

Further, in the motor unit 2, a heat dissipating sheet (in this example, the heat dissipating sheet TS) is disposed between the amplifier board and the heat dissipating member. Thus, in the motor unit 2, the cushioning member and the heat dissipating sheet can be filled between the amplifier board and the heat dissipating member, and it is possible to prevent the occurrence of trouble due to heat generated by the amplifier section.

Moreover, in the motor unit 2, a heat dissipating sheet (in this example, the heat dissipating sheet TS) may be disposed between the amplifier board and the heat dissipating member. Thus, in the motor unit 2, the heat dissipating sheet can be filled between the amplifier board and the heat dissipating member, and it is possible to prevent the occurrence of trouble due to heat generated by the amplifier section.

Moreover, in the robot 1, the amplifier section includes the amplifier cover, and the power line for supplying power to the motor is bound to the amplifier cover. Thus, in the robot 1, it is possible to prevent the power line from interfering with other objects.

Moreover, in the robot 1, the amplifier section is attachable to a housing (in this example, a housing included in the robot 1). Thus, in the robot 1, it is possible by the housing to prevent the occurrence of trouble due to heat generated by the amplifier section.

Moreover, in the robot 1, the amplifier section is located inside the housing. Thus, since the amplifier section 3 is attachable to an object other than the motor 4, it is possible to improve flexibility in selecting a position for assembling to an assembly object in the motor unit.

Moreover, in the robot 1, the housing is movable. Thus, in the robot 1, it is possible by the movable housing to more reliably prevent the occurrence of trouble due to heat generated by the amplifier section.

Moreover, in the robot 1, a portion of the housing, to which the amplifier section is attachable, is the heat dissipating member. Thus, in the robot 1, it is possible, by the portion of the housing to which the amplifier section is attachable and which is the heat dissipating member, to more reliably prevent the occurrence of trouble due to heat generated by the amplifier section.

Moreover, in the robot 1, the housing includes a second opening (in this example, the second opening CA10), and a portion of the housing, to which the amplifier section is attachable, is a lid member (in this example, the lid member CC) covering at least a portion of the second opening. Thus, in the robot 1, it is possible by the lid member covering at least a portion of the second opening to more reliably prevent the occurrence of trouble due to heat generated by the amplifier section, and it is also possible to allow the user to easily perform the maintenance of the amplifier section.

Moreover, in the robot 1, the material of the lid member is metal. Thus, in the robot, it is possible by the lid member of metal to prevent the occurrence of trouble due to heat generated by the amplifier section.

Moreover, in the robot 1, the thermal conductivity of the lid member is 40 W/m·K or more. Thus, in the robot 1, it is possible by the lid member having a thermal conductivity of 40 W/m·K or more to prevent the occurrence of trouble due to heat generated by the amplifier section.

Second Embodiment

Figure 12:
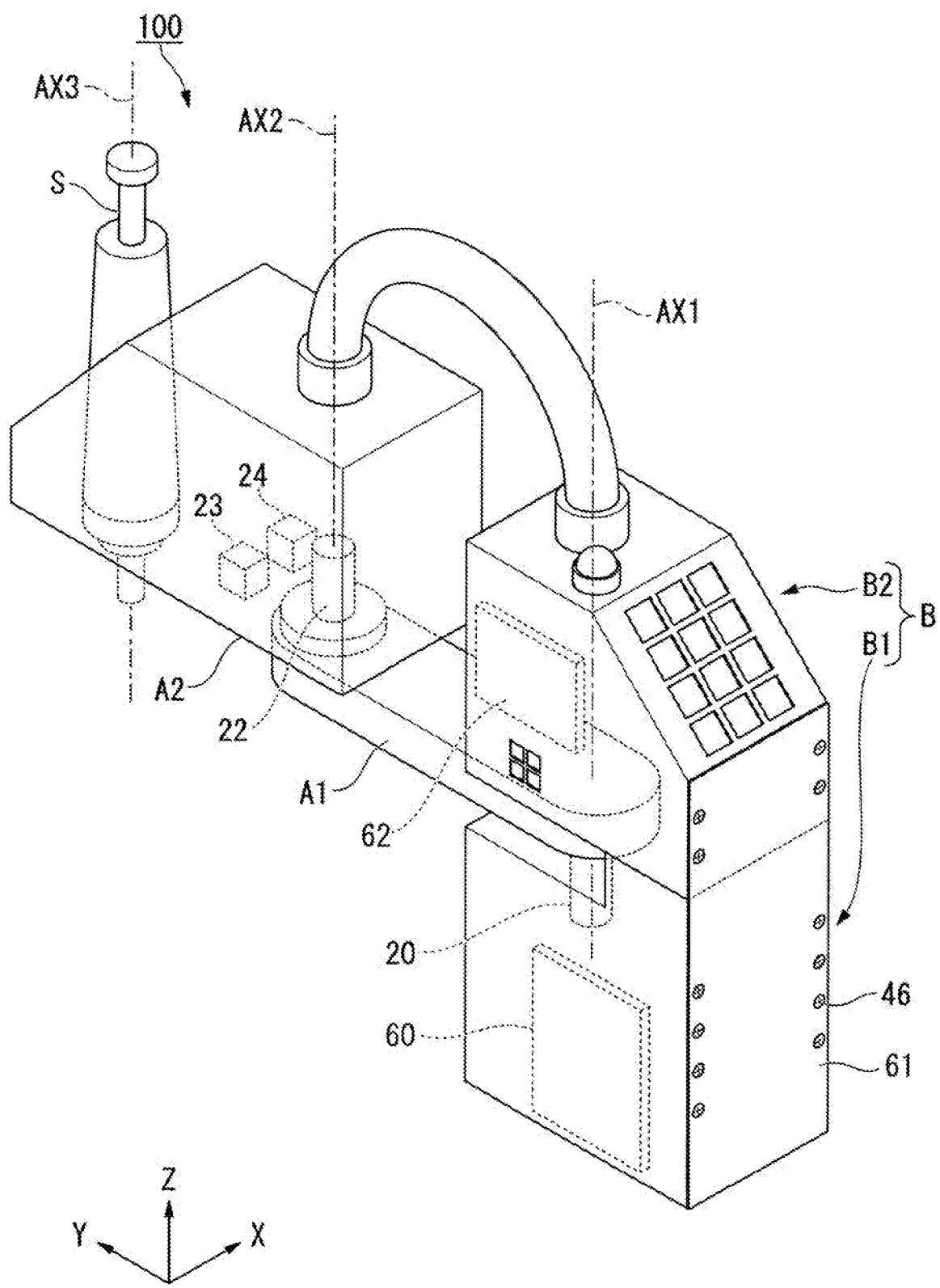
FIG. 12 shows one example of the configuration of a robot according to a second embodiment.

FIG. 12 shows one example of the configuration of a robot 100 according to a second embodiment. Members common to those of the embodiment described above are denoted by the same reference numerals and signs, and a detailed description of the members is omitted. In FIG. 12, an X-Y-Z coordinate system, which is a three-dimensional orthogonal coordinate system, is shown for convenience of description. Hereinafter, the Z-direction is a direction parallel to the first axis AX1, the second axis AX2, and the third axis AX3; the X-direction and the Y-direction are directions orthogonal to the Z-direction; and the X-Y plane is parallel to the installation surface on which the robot 100 is installed.

As shown in FIG. 12, the robot 100 of the embodiment is a SCARA robot including the support base B, the first arm A1, the second arm A2, and the shaft S.

In the embodiment, the support base B includes a base B1 and a housing B2.

The base B1 and the housing B2 are fixed by a covering plate 61. The first arm A1 is rotatably provided relative to the base B1.

A motor unit 20 that rotates the first arm A1 around the first axis AX1 and a control board 60 are accommodated inside the base B1. A drive power supply board 62 is accommodated inside the housing B2.

Figure 13:
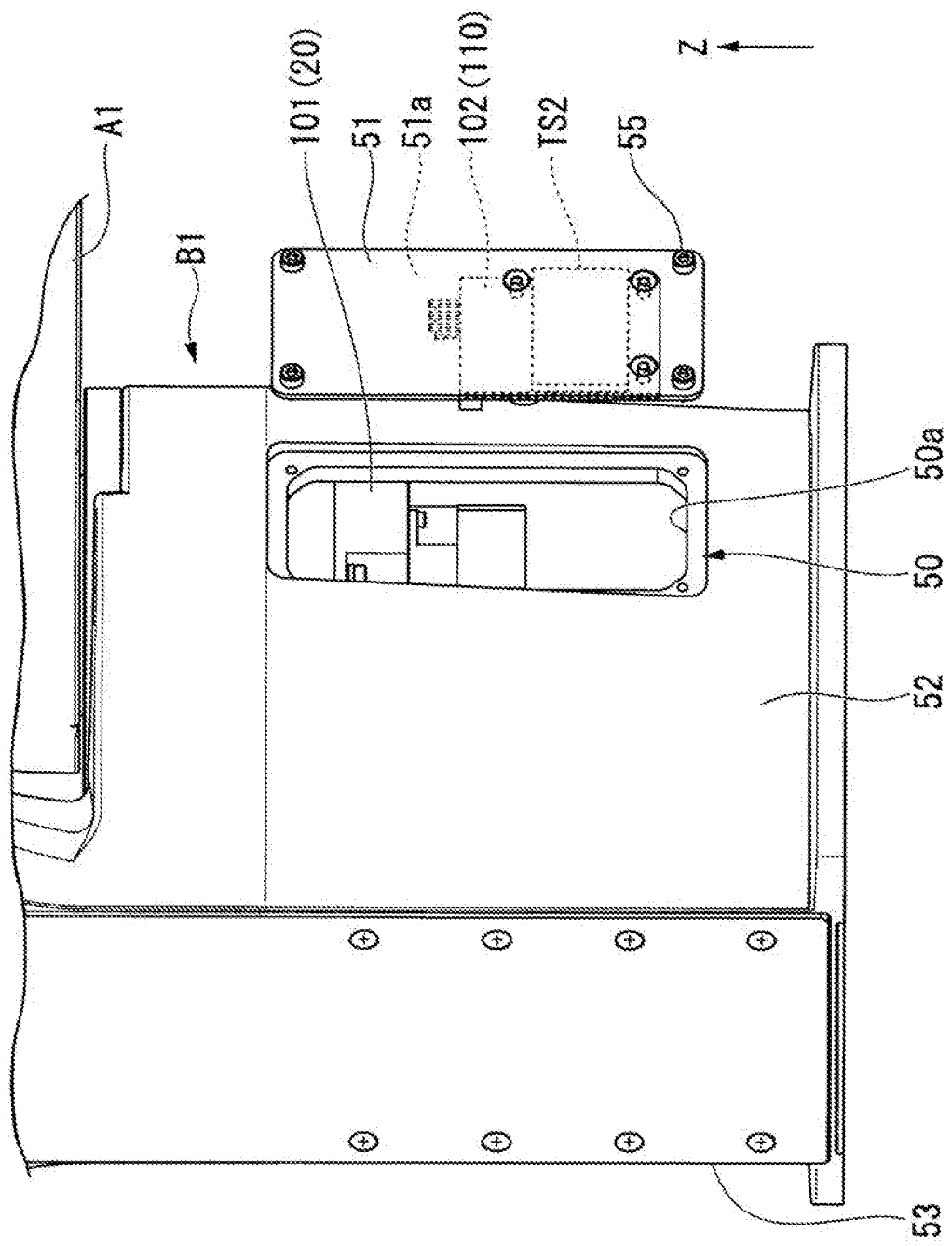
FIG. 13 is a perspective view showing the configuration of an essential portion of a base.

In the embodiment, the motor unit 20 includes a motor 101 and an amplifier section 102 provided separately from the motor 101 (see FIG. 13). As the motor 101, a motor integrated with an encoder (not shown) is used. The amplifier section 102 includes a drive circuit that drives the motor 101, a control circuit that controls the drive circuit, and a communication circuit.

The control board 60 includes, for example, a central processing unit (CPU). The control board 60 performs various kinds of operations with power supplied from the drive power supply board 62, and outputs signals (control signals) for respectively controlling the motor units 20 and 22 to the control circuits of the motor units 20 and 22.

Here, in the robot 100, the motor unit 20 rotating the first arm A1 has a large output compared to the other motor units 22 to 24. Therefore, the amount of heat or vibration generated by the motor is also large.

In contrast to this, since the motor units 22 to 24 provided in the second arm A2 have an output smaller than that of the motor unit 20, the amount of heat or vibration generated by the motor is less compared to the motor unit 20. In the embodiment, a motor unit having a configuration similar to the motor unit 2 of the first embodiment is used as each of the motor units 22 to 24. That is, each of the motor units 22 to 24 is an amplifier-integrated motor in which the motor 4 and the amplifier section 3 are integrated together.

According to the robot 100 of the embodiment, in the motor unit 20 having a large output, the amplifier section 102 is provided in the base B1, so that the motor 101 and the amplifier section 102 are separately provided. Thus, since the heat or vibration generated by the motor 101 is less likely to be conducted or transmitted to the amplifier section 102, it is possible to prevent the influence of vibration or heat from the motor 101 on the amplifier section 102.

Moreover, since an amplifier-integrated motor is used as each of the motor units 22 to 24 excepting the motor unit 20, the robot 100 can be reduced in size compared to the case where a motor provided separately from an amplifier is used for all of the motor units.

When preventing the heat or vibration generated by the motor from being conducted or transmitted to the amplifier section is given priority over reducing the size of the robot, the structure in which the amplifier section and the motor are separately provided as in the motor unit 20 may be adopted for the motor units 22 to 24.

FIG. 13 is a perspective view showing the configuration of an essential portion of the base B1. As shown in FIG. 13, the base B1 includes an opening 50 and a lid member 51 covering at least a portion of the opening 50. The base B1 includes a pair of side plates 52 and 53 opposed to each other in the X-direction. The opening 50 is formed in the side plate 52 located on the +X side.

The lid member 51 is attached to the base B1 with screw members 55. Thus, the lid member 51 is easily detachable with respect to the base B1 by removing the screw members 55.

In the embodiment, the lid member 51 is provided with the amplifier section 102 on an inner surface 51a side of the lid member 51. Therefore, the user can easily take out the amplifier section 102 to the outside of the base B1 by removing the lid member 51 from the base B1 without removing the motor 101. Hence, access from the outside of the base B1 to the amplifier section 102 is greatly facilitated; therefore, even if the amplifier section 102 is broken, the amplifier section 102 may be exchanged by removing the lid member 51. Hence, it is possible to allow the user to easily perform the maintenance of the amplifier section 102.

Figure 14:
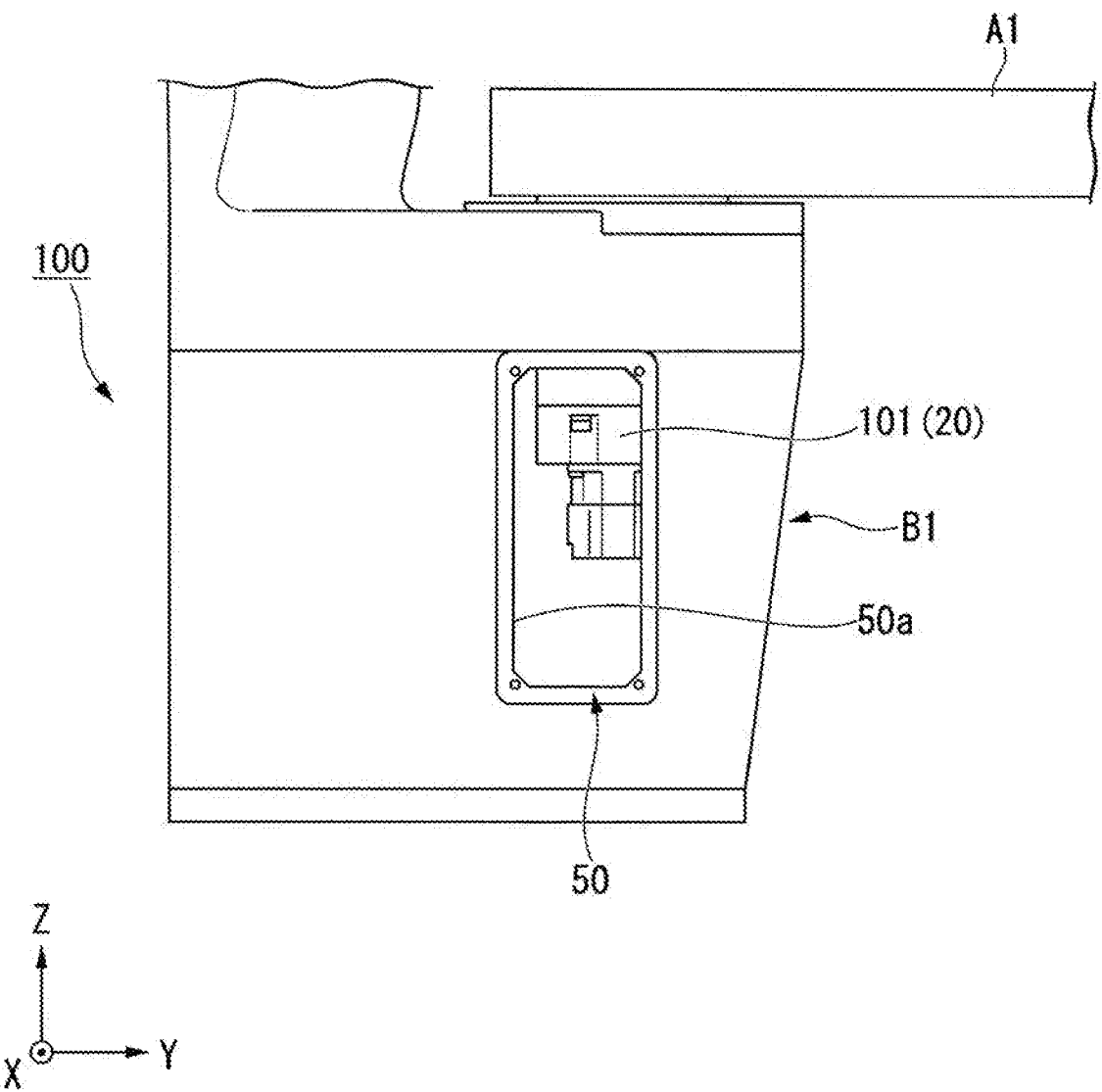
FIG. 14 shows the base when viewed in the opening direction of an opening.

FIG. 14 shows the base B1 when viewed in the opening direction of the opening 50. In FIG. 14, the lid member 51, and the pipe C1 and the power lines C2 to C4, which connect the amplifier section 102 with the motor 101, are not illustrated for clarity of illustration.

As shown in FIG. 14, at least a portion of the motor 101 overlaps an open edge 50a of the opening 50 when viewed in the opening direction (+X-direction) of the opening 50. According to this configuration, since the amplifier section 102 and the motor 101 are disposed in a close state in the state where the lid member 51 is attached, the lengths of the wires (the pipe C1 and the power lines C2 to C4) connecting the amplifier section 102 with the motor 101 can be shortened.

The amplifier section 102 is composed mainly of an amplifier board 110. That is, the amplifier board 110 is attached to the lid member 51. The amplifier board 110 is attached to the lid member 51 with, for example, a screw member (not shown).

A heat dissipating sheet TS2 is provided between the amplifier board 110 and the lid member 51. Thus, since the heat of the amplifier board 110 is easily conducted to the lid member 51 side, heat can be efficiently dissipated from the amplifier board 110.

The heat dissipating sheet TS2 may be provided only in a portion of the space between the amplifier board 110 and the lid member 51. The portion is a portion between the amplifier board 110 and the lid member 51 where the temperature rises highest due to heat generated by the amplifier board 110.

In the embodiment, the lid member 51 functions as a heat dissipating member that dissipates heat generated by the amplifier board 110. Since the lid member 51 forms the exterior surface of the base B1, the heat of the lid member 51 is favorably dissipated to the outside.

The lid member 51 is composed of a heat dissipating member having a predetermined thermal conductivity corresponding to the amount of heat generated by the amplifier board 110. The thermal conductivity of the lid member 51 is preferably 40 W/m·K or more, and more desirably 200 W/m·K or more.

Examples of the material of the lid member 51 capable of realizing such a thermal conductivity can include, for example, resin, iron, aluminum, and copper. Resin has a thermal conductivity approximately ranging from 0.5 to 2 W/m·K. Iron has a thermal conductivity approximately ranging from 40 to 60 W/m·K. Aluminum has a thermal conductivity of approximately 200 W/m·K. Copper has a thermal conductivity approximately ranging from 350 to 400 W/m·K.

According to the embodiment as described above, the amplifier section 102 is provided to the lid member 51 functioning as a heat dissipating member, so that it is possible to prevent the occurrence of trouble due to heat generated by the amplifier section 102.

In the embodiment, the amplifier section 102 may be configured such that the amplifier board 110 is accommodated in the accommodating portion 30 (see FIG. 2) similarly to the amplifier section 3 of the first embodiment. In the first embodiment, the power lines C2 to C4 are bound to the amplifier cover 32 with the first binding portion BB1 and the second binding portion BB2; however, another form can be adopted as the binding structure to bind the power lines C2 to C4.

Figure 15:
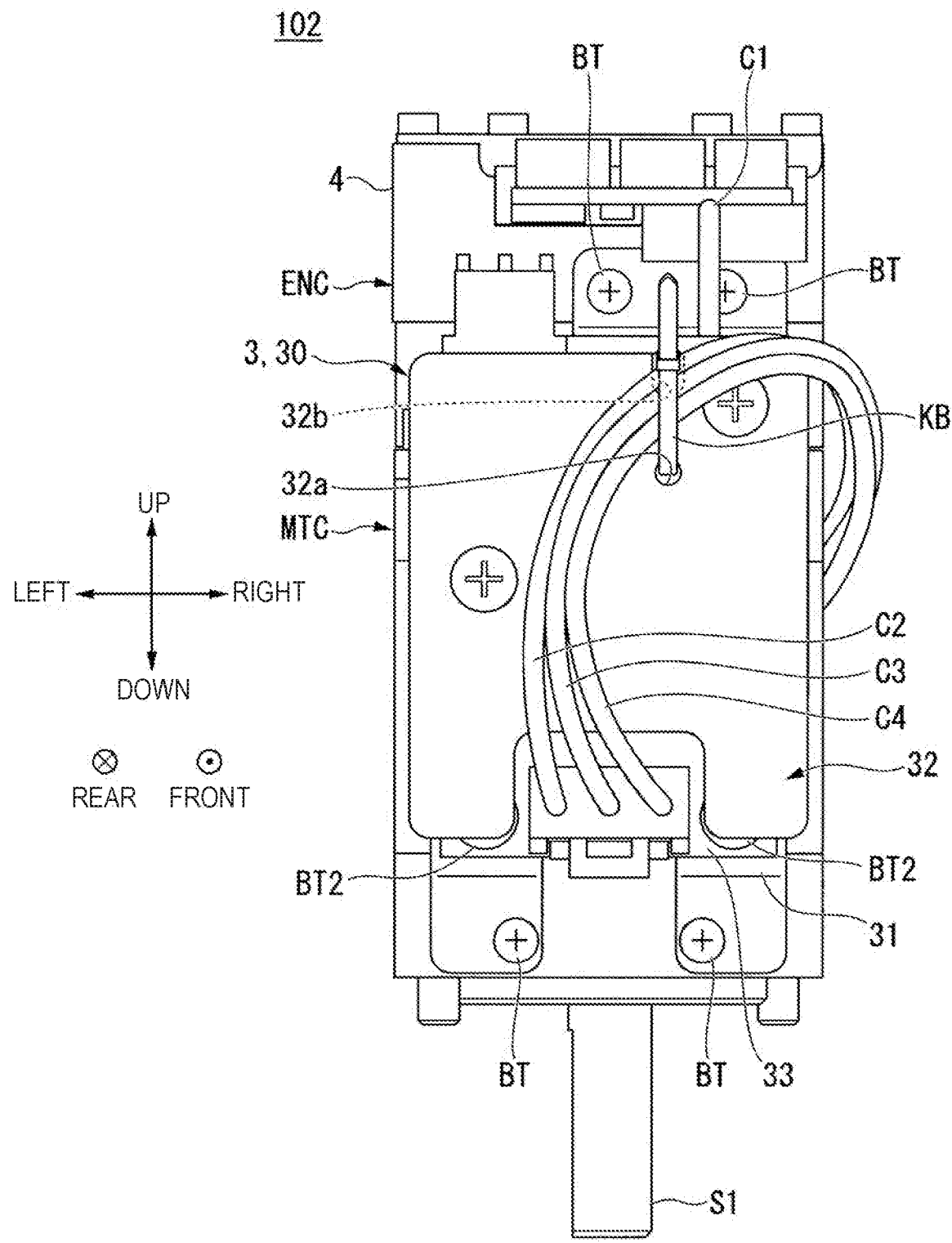
FIG. 15 shows a modified example of a binding structure of power lines.

FIG. 15 shows a modified example of the binding structure. FIG. 15 corresponds to the front view of the motor unit 2 shown in FIG. 2. Members other than the binding structure are denoted by the same reference numerals and signs as those in FIG. 2, and a detailed description of the members is omitted.

For example, as shown in FIG. 15, the power lines C2 to C4 can be bound to the amplifier cover 32 using one cable tie KB. The cable tie KB is inserted through a through-hole 32a and attached to the amplifier cover 32 so as to hang on a notch 32b.

Here, when only the through-hole 32a is formed without forming the notch 32b, the power lines C2 to C4 may have the risk of interfering with other objects because the cable tie KB becomes unsteady. In contrast to this, according to the configuration shown in FIG. 15, the position of the cable tie KB with respect to the amplifier cover 32 is fixed by the through-hole 32a and the notch 32b; therefore, the power lines C2 to C4 can be reliably bound to the amplifier cover 32. Moreover, according to the configuration shown in FIG. 15, the cable tie KB inserted through one through-hole 32a is tightened in the state of hanging on the notch 32b in binding the power lines C2 to C4, the binding working of the power lines C2 to C4 can be performed simply and reliably.

As described above, since the amplifier section 102 is provided in the base B1 in the robot 100 of the embodiment, the motor 101 and the amplifier section 102 are separately provided. Thus, it is possible to prevent the influence of vibration or heat from the motor 101 on the amplifier section 102.

Moreover, since the amplifier section 102 is provided to the lid member 51 in the robot 100, the amplifier section 102 can be taken out from within the base B1 by removing the lid member 51 from the opening 50. Thus, since access to the amplifier section 102 is facilitated, maintainability becomes excellent.

Moreover, in the robot 100, at least a portion of the motor 101 overlaps the open edge 50a of the opening 50 when viewed in the opening direction of the opening 50. Thus, since the distance between the amplifier section 102 and the motor 101 can be reduced, the wires (the pipe C1 and the power lines C2 to C4) connecting the amplifier section 102 with the motor 101 can be shortened.

Moreover, in the robot 100, the heat dissipating sheet TS2 is provided between the amplifier board 110 and the lid member 51. Thus, since the heat of the amplifier board 110 is easily conducted to the lid member 51 side, the heat can be efficiently dissipated from the amplifier board 110.

Moreover, the robot 100 includes the lid member 51 having a thermal conductivity of 40 W/m·K or more. Thus, in the robot 100, it is possible by the lid member 51 having a thermal conductivity of 40 W/m·K or more to prevent the occurrence of trouble due to heat generated by the amplifier section 102.

Alternatively, the robot 100 includes the lid member 51 having a thermal conductivity of 200 W/m·K or more. Thus, in the robot 100, it is possible by the lid member 51 having a thermal conductivity of 200 W/m·K or more to prevent the occurrence of trouble due to heat generated by the amplifier section 102.

Moreover, in the robot 100, an amplifier-integrated motor is used as each of the motor units 22 to 24 provided in the second arm A2. Thus, compared to the case where a motor provided separately from an amplifier is used for all of the motor units, the entire configuration can be reduced in size.

Instead of a SCARA robot, the robot 100 may be other robots such as a vertical articulated robot or a Cartesian-coordinate robot. The vertical articulated robot may be a single-arm robot including one arm, may be a dual-arm robot including two arms (a multi-arm robot including two arms), or may be a multi-arm robot including three or more arms. The Cartesian-coordinate robot is, for example, a gantry robot.

An example has been described, in which, in the robot 100, the motor unit 20 includes the motor 101 and the amplifier section 102 provided separately, and both the motor 101 and the amplifier section 102 are provided in the base B1. In the robot 100, the motor 101 may be provided in the base B1 while the amplifier section 102 may be provided in the housing B2; the motor 101 may be provided in the housing B2 while the amplifier section 102 may be provided in the base B1; and both the motor 101 and the amplifier section 102 may be provided in the housing B2.

Third Embodiment

Hereinafter, a third embodiment will be described with reference to the drawings.

In the drawings used for the following description, an X-Y-Z coordinate system is shown. In the following description, each direction will be described as necessary based on each coordinate system. In the specification, each portion will be described with the +Z-direction being upward; however, the attitude of a robot is not limited to this attitude.

In the specification, the phrase "along a certain direction (specified direction)" includes, in addition to the case of being along the specified direction in a strict sense, the case of being along a direction inclined in the range of less than 45° with respect to the specified direction.

Figure 16:
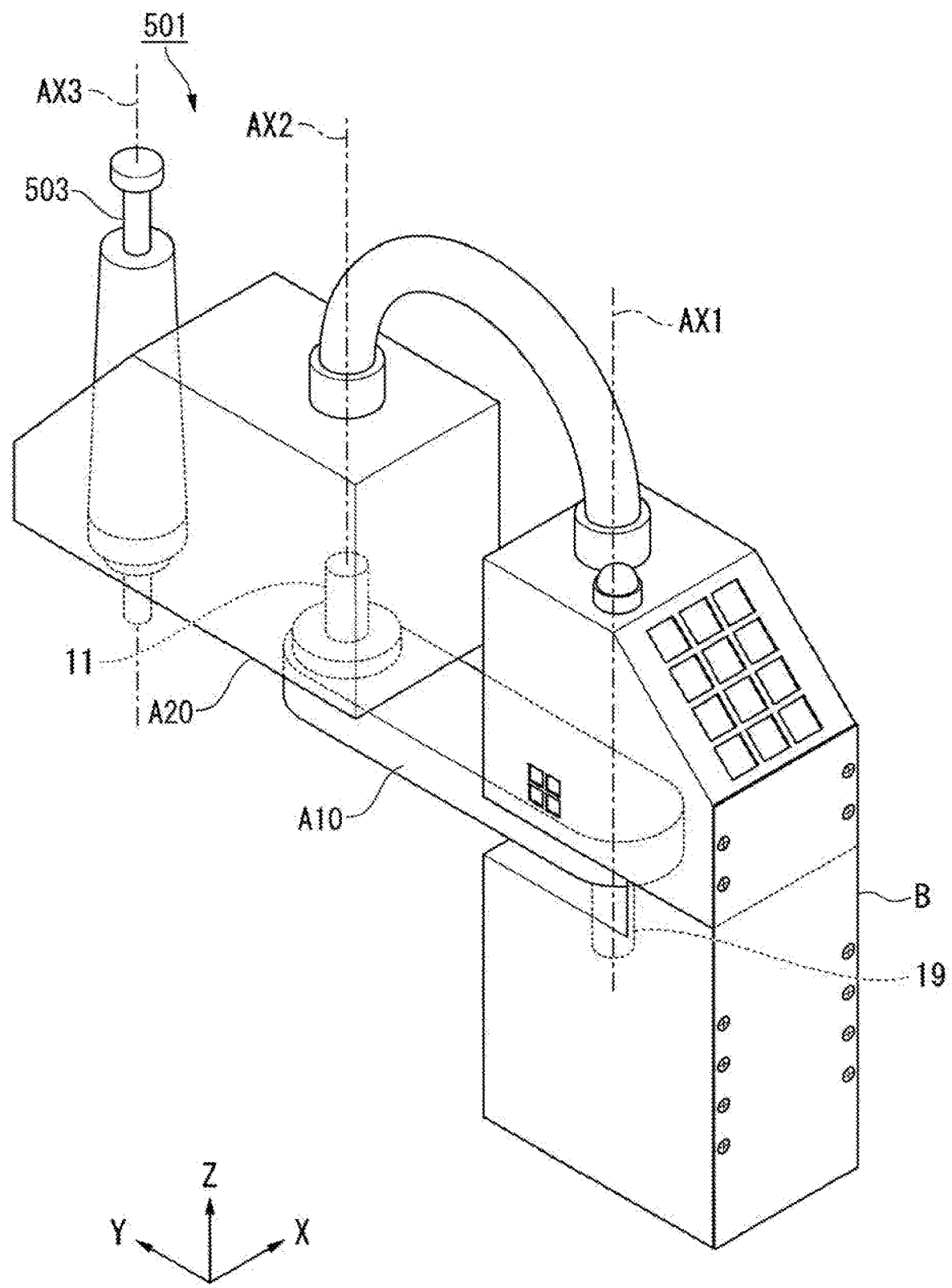
FIG. 16 is a perspective view showing a robot of a third embodiment.

FIG. 16 is a schematic perspective view of a robot 501 according to the embodiment.

The robot 501 of the embodiment is a SCARA robot. The robot 501 includes the support base B, a first arm A10, a second arm A20, and an actuating shaft body 503.

The support base B is installed on an installation surface such as a floor surface or a wall surface. The first arm A10 is supported to the support base B. The first arm A10 rotates around the first axis AX1 by a motor unit 19 provided inside the support base B. The second arm A20 is rotatably supported by the first arm A10 around the second axis AX2. The actuating shaft body 503 is supported to the second arm A20. The actuating shaft body 503 is rotatable around the third axis AX3 and translatable in the axial direction of the third axis AX3.

In the embodiment, the support base B of the robot 501 is fixed to the floor surface parallel to the X-Y plane. All of the first axis AX1, the second axis AX2, and the third axis AX3 are parallel to the up-and-down direction (Z-axis direction). The first arm A10 and the second arm A20 of the robot 501 operate in parallel with the X-Y plane. In the specification, the state of components when viewed in the axial direction of the second axis AX2 is defined as a plan view.

Figure 17:
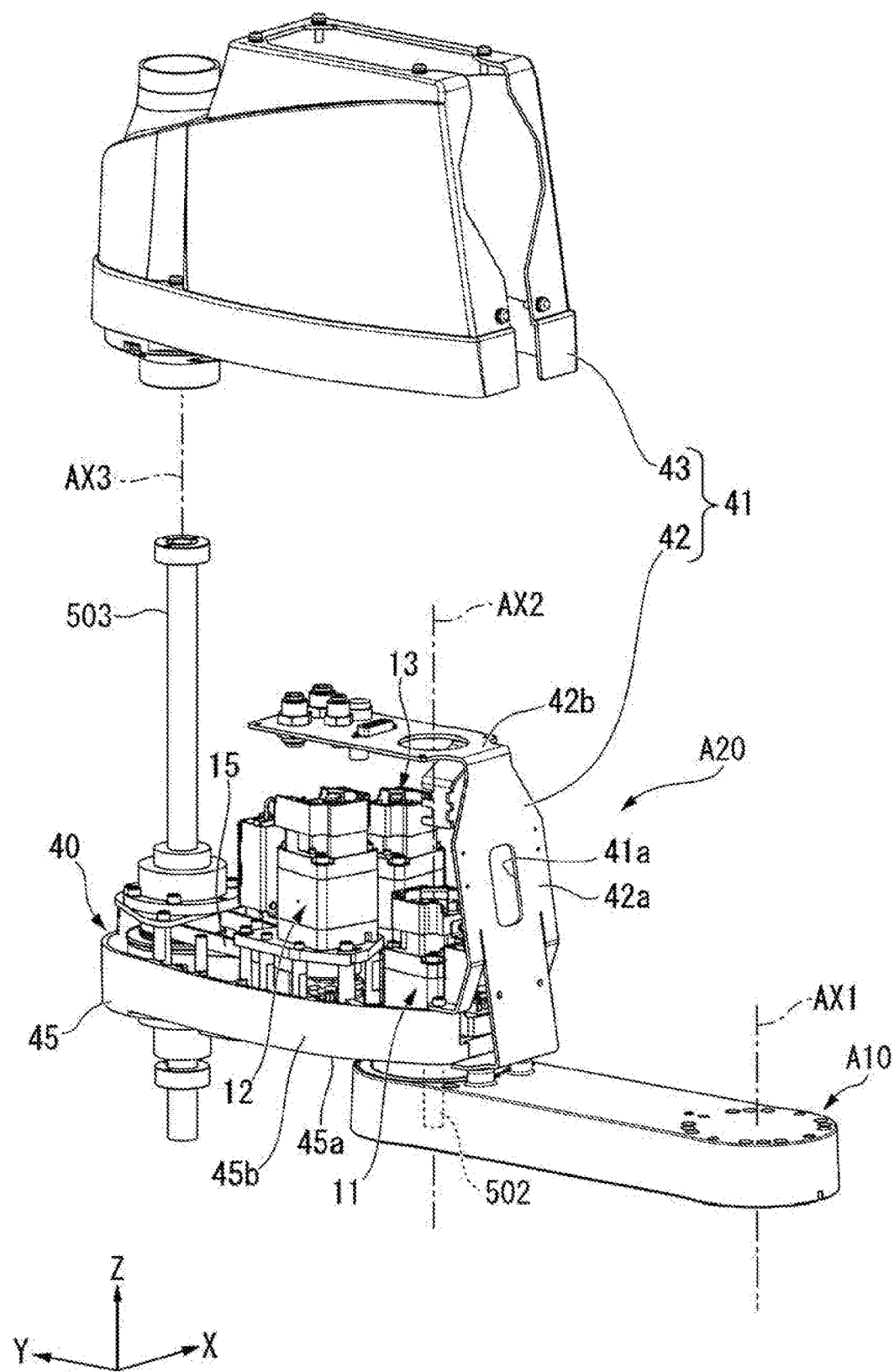
FIG. 17 is an exploded perspective view of a second arm of the third embodiment.

FIG. 17 is an exploded perspective view of the second arm A20.

The second arm A20 includes an arm main body 40, an arm cover 41, a first motor unit 11, a second motor unit 12, a third motor unit 13, a rotating shaft body 502 extending along the second axis (rotation axis) AX2, and the actuating shaft body 503 extending along the third axis (actuation axis) AX3.

The arm main body 40 holds the arm cover 41, the first to third motor units 11, 12, and 13, the actuating shaft body 503, and the rotating shaft body 502. The arm main body 40 includes a lower cover 45. The lower cover 45 includes a bottom plate portion 45a to which the first to third motor units 11, 12, and 13 are fixed from above, and a side wall portion 45b projecting upward from the outer edge of the bottom plate portion 45a. The lower cover 45 covers the lower side of the second arm A20.

The arm cover 41 covers the first to third motor units 11, 12, and 13 (i.e., a plurality of motors 520 and a plurality of amplifier sections 530) in the plan view. The arm cover 41 includes a frame body 42 and a cover main body 43. The frame body 42 is formed by sheet metal working. The frame body 42 includes an erected portion 42a erected upward at the side of the rotating shaft body 502, and an upper end portion 42b extending from the upper end of the erected portion 42a in the horizontal direction. The frame body 42 is fixed to the lower cover 45 at the lower end of the erected portion 42a. The cover main body 43 is fixed to the frame body 42 and the lower cover 45.

Figure 18:
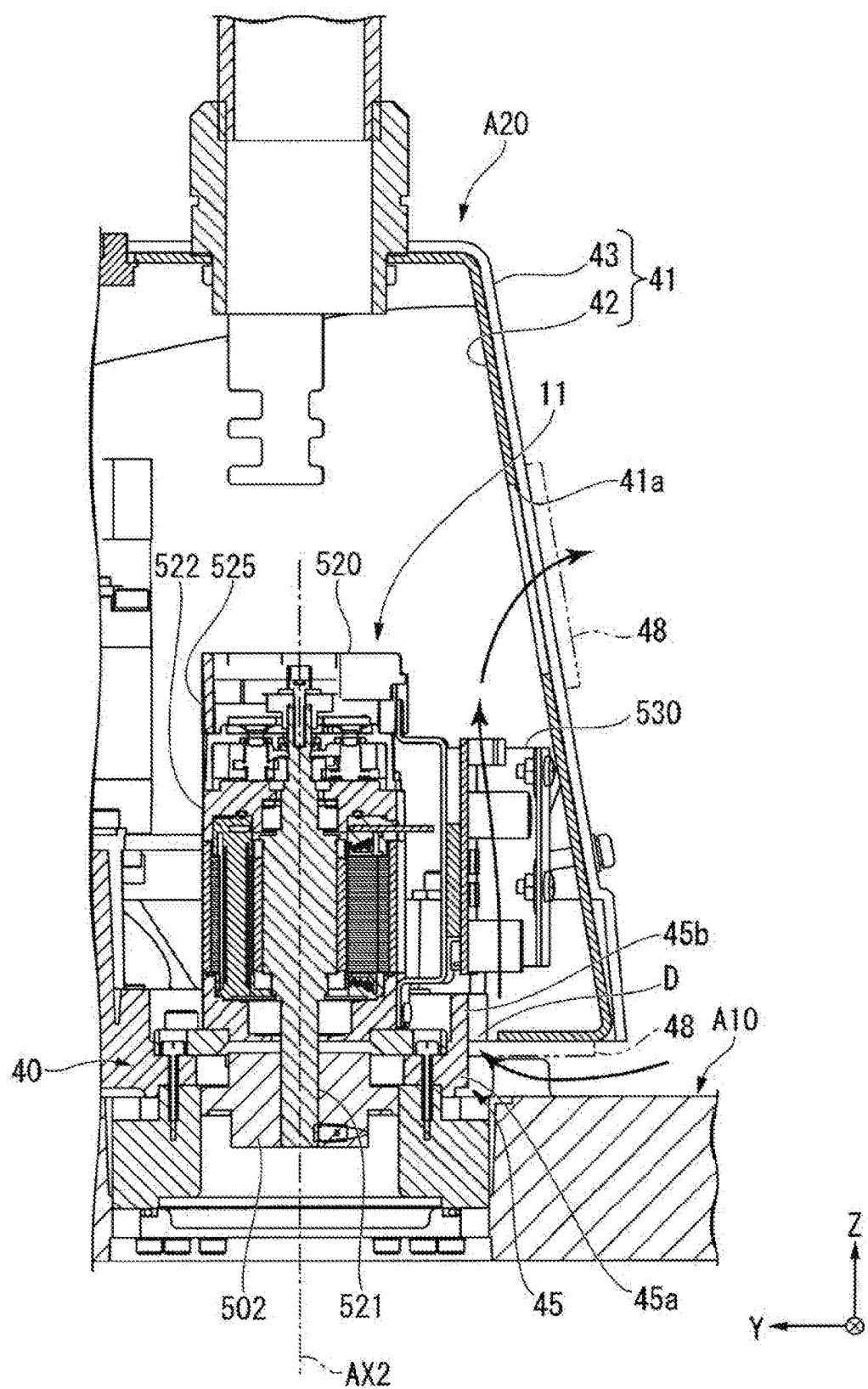
FIG. 18 is a cross-sectional view of the second arm of the third embodiment around a second axis.

FIG. 18 is a cross-sectional view of the second arm A20 around the second axis AX2.

A gap D extending in the horizontal direction is provided between the arm cover 41 and the lower cover 45. That is, the internal space of the second arm A20 surrounded by the arm cover 41 and the lower cover 45 is opened in the up-and-down direction to the outside at the gap D. The gap D is located directly below the amplifier section 530 of the first motor unit 11.

The arm cover 41 is provided with a vent hole 41a directly above the amplifier section 530 of the first motor unit 11. The vent hole 41a provides communication between the outside and the internal space of the second arm A20 surrounded by the arm cover 41 and the lower cover 45.

Figure 19:
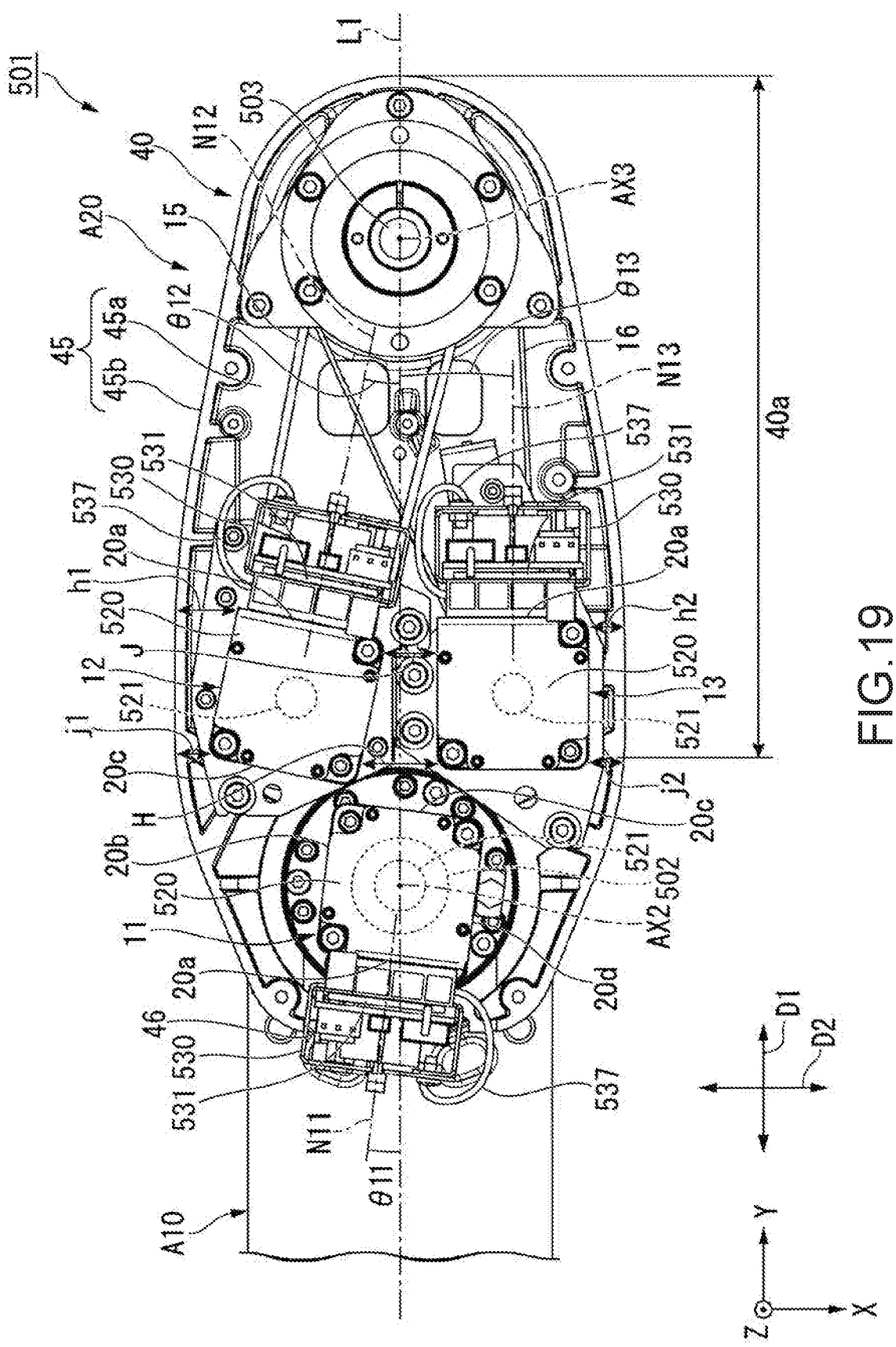
FIG. 19 is a plan view of the second arm of the third embodiment.

FIG. 19 is a plan view of the second arm A20. In FIG. 19, the arm cover 41 is removed.

The first motor unit 11 is fixed to the arm main body 40. The first motor unit 11 rotationally drives the rotating shaft body 502 with respect to the arm main body 40. Since the rotating shaft body 502 is fixed to the first arm A10, the second arm A20 rotates around the second axis AX2 with respect to the first arm A10 due to the rotating shaft body 502 driven rotationally.

The second motor unit 12 moves (raises or lowers) the actuating shaft body 503 in the up-and-down direction. The actuating shaft body 503 is provided with a ball screw groove (not shown). The actuating shaft body 503 is supported to the arm main body 40 via a ball screw nut (not shown) fitted to the ball screw groove. The second motor unit 12 rotates the ball screw nut via a timing belt 15 to thereby raise or lower the actuating shaft body 503.

The third motor unit 13 rotates the actuating shaft body 503 around the third axis AX3 via a timing belt 16. That is, the actuating shaft body 503 is moved in the up-and-down direction by the second motor unit 12, and rotated about the axis by the third motor unit 13.

Figure 20:
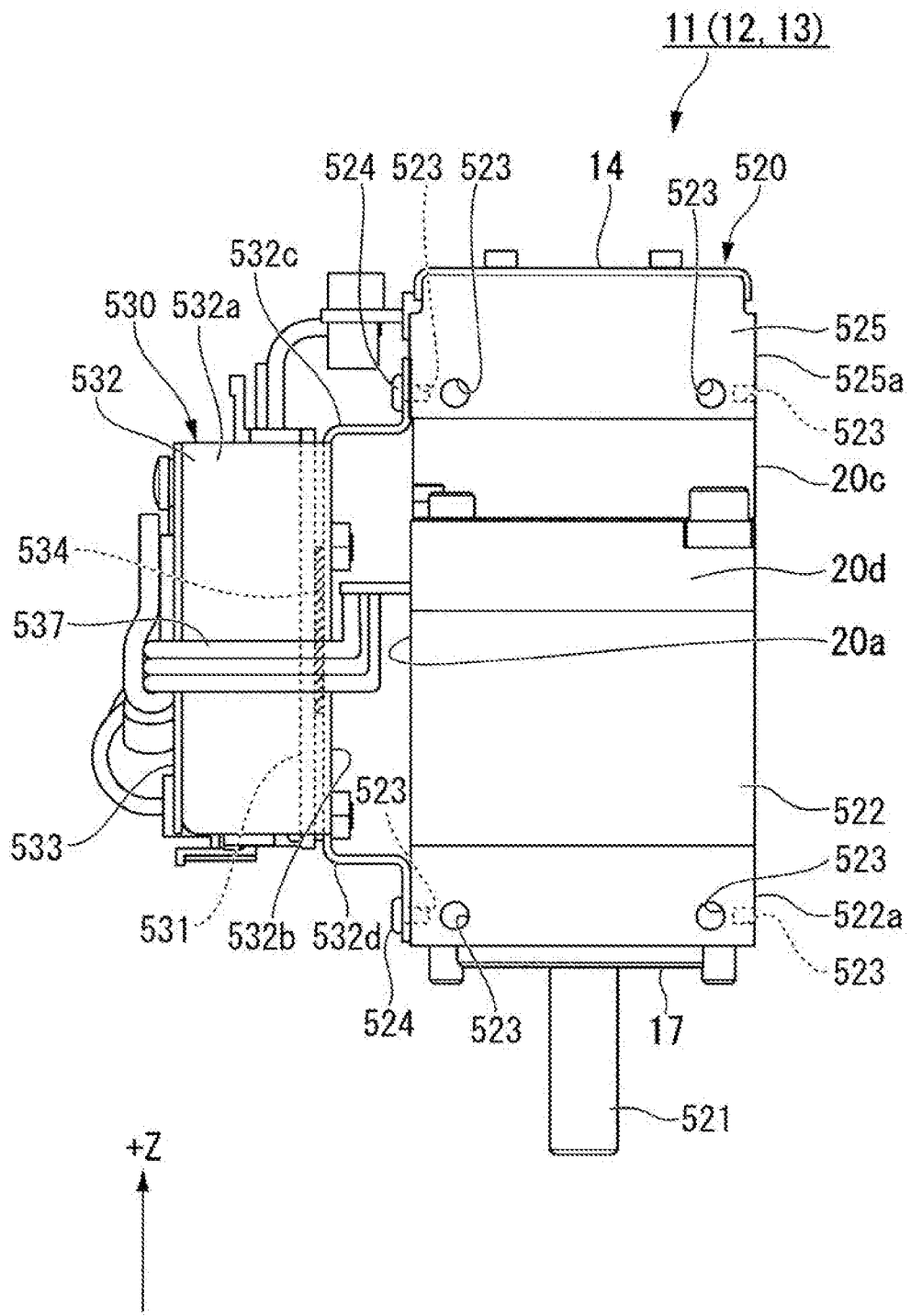
FIG. 20 is a side view of a first motor unit of the third embodiment.

FIG. 20 is a side view of the first motor unit 11.

In the embodiment, the first to third motor units 11, 12, and 13 have similar configurations. The configuration to be described below with respect to the first motor unit 11 similarly applies to the second and third motor units 12 and 13 unless particularly specified.

The first motor unit 11 includes the motor 520 and the amplifier section 530 including an amplifier board 531 on which a drive circuit that drives the motor 520 is mounted.

The motor 520 is disposed with the axial direction of a shaft 521 aligned with the Z-axis direction. The motor 520 has a rectangular shape when viewed in the axial direction of the shaft 521. The motor 520 has a rectangular parallelepiped shape. The motor 520 includes the shaft 521, a motor main body 522, and an encoder 525.

The amplifier section 530 is provided on the motor 520. The amplifier section 530 is attachable/detachable with respect to the motor 520. The amplifier section 530 is provided with cables 537 that laterally project. The amplifier section 530 may be directly provided on the arm main body 40 (i.e., the second arm A20).

The motor main body 522 and the encoder 525 are stacked on and fixed to each other in the axial direction of the shaft 521. The motor main body 522 rotates the shaft 521. The motor main body 522 of the embodiment is a three-phase AC motor. The motor main body 522 may be other motors. The motor main body 522 includes a motor housing 522a surrounding the internal structure from radially outside of the shaft 521.

The encoder 525 detects the rotation angle of the shaft 521. The encoder 525 may be a magnetic encoder, an optical encoder, or a combination of them. The encoder 525 includes an encoder housing 525a surrounding the internal structure from radially outside of the shaft 521.

The motor 520 has a substantially rectangular parallelepiped shape vertically elongated along the axial direction of the shaft 521. The outer peripheral surface of the motor 520 includes first to fourth surfaces 20a, 20b, 20c, and 20d (see FIG. 19 for the second surface 20b) surrounding the periphery of the shaft 521, and a bottom surface 17 and an upper surface 14 both orthogonal to the axial direction of the shaft 521. The shaft 521 projects downward from the bottom surface 17.

As shown in FIG. 19, the first surfaces 20a of the second and third motor units 12 and 13 both face toward the third axis AX3 side (i.e., in the +Y-direction). The first surface 20a of the first motor unit 11 faces opposite the first surfaces 20a of the second and third motor units 12 and 13.

As shown in FIG. 20, each of the first to fourth surfaces 20a, 20b, 20c, and 20d of the motor 520 is provided with four screw holes (attachment/detachment portions) 523.

Two screw holes 523 of the four screw holes 523 are provided in the encoder housing 525a, and the remaining two screw holes 523 are provided in the motor housing 522a. The four screw holes 523 provided in each of the surfaces function as attachment/detachment portions for fixing the amplifier section 530 to the surface. In all of the first to third motor units 11, 12, and 13 of the embodiment, the amplifier section 530 is fixed to the first surface 20a. Hence, the amplifier section 530 is fixed by inserting screws (fixing members) 524 into the four screw holes 523 provided in the first surface 20a. In the embodiment, the screw holes 523 provided in each of the second to fourth surfaces 20b, 20c, and 20d are not used.

The motor (first motor) 520 of the first motor unit 11 of the embodiment is provided with, in the first surface (first position) 20a, the four screw holes (first attachment/detachment portions) 523 allowing the amplifier section (first amplifier section) 530 for driving the motor 520 to be attachable/detachable. Moreover, the motor (first motor) 520 of the first motor unit 11 is provided with, in the second to fourth surfaces (second to fourth positions) 20b, 20c, and 20d, the four screw holes (second to fourth attachment/detachment portions) 523 allowing the amplifier section (first amplifier section) 530 to be attachable/detachable. According to the embodiment, the amplifier section 530 can be attached to the motor 520 in various positions. Hence, the attachment position of the amplifier section 530 can be changed according to the installation space, and common use of components of the motor units can be achieved.

In the motor 520 of the embodiment, the first to fourth positions (i.e., the first to fourth surfaces 20a, 20b, 20c, and 20d) in which the amplifier section 530 can be attached are located on different surfaces of the surfaces of the motor 520. Hence, the direction of the amplifier section 530 with respect to the motor 520 can be changed by changing the attachment position of the amplifier section 530.

The first to fourth positions in which the amplifier section 530 can be attached may be on the same surface of the surfaces of the motor 520 but at different heights.

Further, since the first to third motor units 11, 12, and 13 in the embodiment include the amplifier sections 530 similar to each other, the amplifier section 530 of another motor unit may be attached to the motor 520 of the first motor unit 11.

The amplifier section 530 includes an amplifier board 531, a bracket 532, and an amplifier cover 533. The amplifier section 530 is fixed to the first surface 20a of the motor 520 via the bracket 532. Cables routed from the support base B and used for power supply and control are connected to the amplifier section 530. Moreover, cables connected to the motor 520 for supplying power to the motor 520 and controlling the same are connected to the amplifier section 530.

The amplifier board 531 amplifies power supplied from a power source and supplies the power to the motor main body 522. More specifically, when causing the motor main body 522 to operate, the amplifier board 531 supplies the power to respective coils (not shown) of three phases included in the motor 520 at the timing in response to the control signal. The bracket 532 is made of a material having a high thermal conductivity, and is made of, for example, aluminum.

The bracket 532 includes a pair of side plate portions 532a, a back plate portion 532b, a first leg plate portion 532c, and a second leg plate portion 532d. The bracket 532 is formed by sheet metal working.

The pair of side plate portions 532a are opposed to each other with the amplifier board 531 interposed therebetween. The surface direction of the pair of side plate portions 532a is orthogonal to the surface direction of the amplifier board 531. The pair of side plate portions 532a extend in the vertical direction.

The back plate portion 532b of the bracket 532 connects the pair of side plate portions 532a together. The back plate portion 532b is located between the amplifier board 531 and the first surface 20a of the motor 520. The back plate portion 532b is disposed along the amplifier board 531. Hence, the surface direction of the back plate portion 532b coincides with the surface direction of the amplifier board 531. The back plate portion 532b is in contact with the amplifier board 531 via a heat transfer sheet 534. On the other hand, a gap is provided between the back plate portion 532b and the first surface 20a of the motor 520.

The first leg plate portion 532c of the bracket 532 extends from the upper end of the back plate portion 532b toward the motor 520. The second leg plate portion 532d extends from the lower end of the back plate portion 532b toward the motor 520. The tip end portions of the first leg plate portion 532c and the second leg plate portion 532d are bent so as to be parallel to the first surface of the motor 520, and are provided with holes through which screws are inserted. The screws 524 inserted through the first and second leg plate portions 532c and 532d are inserted into the screw holes 523 in the first surface 20a of the motor 520, so that the bracket 532 is fixed to the motor 520. In the embodiment, the first and second leg plate portions 532c and 532d are portions of the bracket 532. However, the first and second leg plate portions 532c and 532d may be provided separately from the bracket 532. In that case, the first and second leg plate portions 532c and 532d function as intervening members intervening between the amplifier section 530 and the screw holes (attachment/detachment portions) 523.

The heat transfer sheet 534 intervenes between the back plate portion 532b of the bracket 532 and the amplifier board 531. The heat transfer sheet 534 is in surface contact with the back plate portion 532b and the amplifier board 531. The heat transfer sheet 534 transfers heat generated by the amplifier board 531 to the bracket 532. The bracket 532 has a large exposed surface area and therefore has excellent heat dissipating efficiency. The bracket 532 functions as a heat sink for dissipating the heat from the amplifier board 531.

Arrangement of Motor

Next, the arrangement of the first to third motor units 11, 12, and 13 provided in the arm main body 40 will be described.

As shown in FIG. 19, a straight line connecting the second axis AX2 with the third axis AX3 when viewed in the axial direction (Z-axis direction) of the second axis AX2 is defined as a first straight line L1. Here, a direction (the Y-axis direction in FIG. 19) parallel to the first straight line L1 is defined as a first direction D1. Moreover, a direction orthogonal to the first direction D1 is defined as a second direction D2. The arm main body 40 is formed vertically elongated in one direction (the first direction D1) with its longitudinal direction coinciding with the first direction D1 and its transverse direction coinciding with the second direction D2 in the plan view.

The first motor unit 11 directly drives the rotating shaft body 502. The shaft 521 of the first motor unit 11 is connected with the rotating shaft body 502 in the state where the centers thereof coincide with each other. For this reason, the first motor unit 11 is located on the second axis AX2 of the rotating shaft body 502. The first motor unit 11 is located on the first straight line L1.

The second and third motor units 12 and 13 are arranged along the second direction. In two regions defined by the first straight line L1 inside the arm main body 40 in the plan view, the second motor unit 12 is located on one side while the third motor unit 13 is located on the other side.

The second and third motor units 12 and 13 are components each having the largest weight among the components mounted on the arm main body 40. In the second arm A20 rotating about the second axis AX2, the moment of inertia is increased when a component having a large weight is disposed away from the second axis AX2. Moreover, when the moment of inertia is increased, it is difficult to precisely control the second arm A20. By disposing the second and third motor units 12 and 13 to be arranged in the second direction D2, the second and third motor units 12 and 13 can be disposed close to the second axis AX2 compared to the case where the second and third motor units 12 and 13 are disposed to be arranged in the first direction D1. Thus, the moment of inertia of the second arm A20 can be reduced.

In the first to third motor units 11, 12, and 13, the motor 520 and the amplifier section 530 are disposed along the first direction D1. That is, in the first to third motor units 11, 12, and 13, the direction of the amplifier section 530 with respect to the motor 520 is along the first direction D1. The direction of the amplifier section 530 with respect to the motor 520 is the direction of a straight line connecting the center (the central axis of the shaft 521) of the motor 520 with the center of the projected area of the amplifier section 530 when viewed from the center of the motor 520. The second arm A20 is increased in size in the second direction D2 (i.e., the width direction) when it is intended to secure the space in the second direction D2 coincident with the transverse direction. The range of movement of the second arm A20 is narrowed when the second arm A20 is increased in size in the width direction. On the other hand, since the longitudinal direction of the second arm A20 is coincident with the first direction D1, it is easy to secure the accommodating space along the first direction D1. By disposing the motor 520 and the amplifier section 530 along the first direction D1, the space in the longitudinal direction of the second arm A20 is effectively utilized, and it is possible to prevent the second arm A20 from being enlarged in the second direction D2.

In the embodiment, the case where the amplifier section 530 is disposed in the first direction D1 with respect to the motor 520 in the first to third motor units 11, 12, and 13 has been illustrated. However, the effect described above can be provided as long as the amplifier section 530 is disposed in a direction different from the second direction D2 with respect to the motor 520. Specifically, the amplifier section 530 may be disposed in the central axis direction (Z-axis direction) of the shaft 521 with respect to the motor 520.

In the first to third motor units 11, 12, and 13, the motor 520 is disposed in a position closer to the second axis AX2 than the amplifier section 530. In the first to third motor units 11, 12, and 13, the motor 520 is generally larger in weight than the amplifier section 530. Hence, the centers of gravity of the first to third motor units 11, 12, and 13 each including the motor 520 and the amplifier section 530 are located on the motor 520 side. By disposing the motor 520 on the second axis AX2 side with respect to the amplifier section 530, the centers of gravity of the first to third motor units 11, 12, and 13 are brought close to the second axis AX2 and thus the moment of inertia can be reduced.

As shown in FIG. 19, the amplifier boards 531 of the first to third motor units 11, 12, and 13 face in predetermined normal directions N11, N12, and N13 in the plan view. In the embodiment, the normal of the amplifier board 531, which passes through the center of the amplifier section 530, passes through the center of the motor 520. Hence, each of the normal directions N11, N12, and N13 of the amplifier boards 531 coincides with the direction of the amplifier section 530 with respect to the motor 520. In the following description, each of the normal directions N11, N12, and N13 of the amplifier sections 530 is defined as being the same as the direction of the amplifier section 530 with respect to the motor 520.

The normal direction N11 of the amplifier board 531 of the first motor unit 11 is non-parallel to the first direction D1. Thus, the amplifier section 530 including the cables 537 can be disposed in the center of a first opening 46 provided in the lower cover 45 to be described in a later section.

Since the cables 537 of the second motor unit 12 are disposed on the outside with respect to the first straight line L1, it is necessary to prevent the cables 537 from being interposed between the arm cover 41 (see FIG. 17) and the lower cover 45. For this reason, it is preferred to set the dimension of the entire motor unit including the cables 537 to the dimension of the second motor unit 12. In the second motor unit 12, the width of the amplifier section 530 including the cables 537 is larger than the width of the motor 520. The "width" as used herein means a dimension in a direction orthogonal to the normal direction N12 of the amplifier board 531. In the embodiment, the second motor unit 12 is disposed in an inclined manner such that the amplifier section 530 is directed to the first straight line side. That is, the normal direction N12 of the amplifier board 531 of the second motor unit 12 is non-parallel to the first direction D1. Thus, the entire second motor unit 12 including the cables 537 is reduced in dimension along the second direction D2. As a result, the width dimension (dimension along the second direction D2) of the second arm A20 can be reduced.

The normal direction N13 of the amplifier board 531 of the third motor unit 13 is parallel to the first direction D1. Thus, the third motor unit 13 is reduced in dimension along the second direction D2. That is, the space along the second direction D2 for accommodating the third motor unit 13 is reduced in the second arm A20. As a result, the dimension of the second arm A20 along the second direction D2 can be reduced.

In the embodiment, the second motor unit 12 and the third motor unit 13 are disposed to be arranged in the second direction D2.

In the plan view, a shortest distance j1 along the second direction D2 between the motor 520 of the second motor unit 12 and the outer edge of the arm main body 40 is shorter than the thickness of the amplifier section 530. Similarly, a shortest distance j2 along the second direction D2 between the motor 520 of the third motor unit 13 and the outer edge of the arm main body 40 is shorter than the thickness of the amplifier section 530. Thus, the distance between the motor 520 and the outer edge of the arm main body 40 can be shortened to reduce the dimension of the arm main body 40 along the second direction D2. Further, a shortest distance J along the second direction D2 between the motors 520 of the second and third motor units 12 and 13 is shorter than the thickness of the amplifier section 530. Thus, the distance between the motors 520 of the second and third motor units 12 and 13 can be shortened to reduce the dimension of the arm main body 40 along the second direction D2.

The "thickness of the amplifier section 530" as used herein means the length of the amplifier section 530 in the normal direction N12 or N13 of the amplifier board 531.

Moreover, the outer edge of the arm main body 40 substantially coincides with the outer edge of the second arm A20 in the second direction D2.

In the plan view, a longest distance h1 along the second direction D2 between the motor 520 (first motor) of the second motor unit 12 and the outer edge of the arm main body 40 on the side opposite to the motor 520 (second motor) of the third motor unit 13 with respect to the motor 520 of the second motor unit 12 is shorter than the thickness of the amplifier section 530. Similarly, a longest distance h2 along the second direction D2 between the motor 520 (second motor) of the third motor unit 13 and the outer edge of the arm main body 40 on the side opposite to the motor 520 (first motor) of the second motor unit 12 with respect to the motor 520 of the third motor unit 13 is shorter than the thickness of the amplifier section 530. That is, the longest distances h1 and h2 in the second direction D2 between the motors 520 that are located at both ends in the second direction D2, in the plurality of motors (the motors 520 of the second and third motor units 12 and 13), and the outer edge of the arm main body 40 located on the outside of each of the motors are each shorter than the thickness of the amplifier section 530. Further, a longest distance H along the second direction D2 between the motors 520 of the second and third motor units 12 and 13 is shorter than the thickness of the amplifier section 530. A gap in which the amplifier section 530 is provided is not present between the outer edge of the arm main body 40 and the motors 520 of the second and third motor units 12 and 13 and between the motors 520 of the second and third motor units 12 and 13. As a result, the dimension of the second arm A20 along the second direction D2 can be reduced. Moreover, the amplifier section 530 is disposed in the first direction D1 with respect to the motor 520.

In the embodiment, the external form of the motor 520 of the third motor unit 13 is parallel to the outer edge of the arm main body 40 located at the side of the motor 520. Hence, the shortest distance j2 and the longest distance h2 are the same as each other at the third motor unit 13 and the outer edge of the arm main body 40.

In the first to third motor units 11, 12, and 13, angles θ11, θ12, and θ13 formed by the normal directions N11, N12, and N13 of the amplifier boards 531 and the first direction D1 are preferably 0° or more and 45° or less, and more preferably 5° or more and 20° or less. Since the normal direction N13 of the amplifier board 531 of the third motor unit 13 is parallel to the first direction D1, the angle θ13 is 0°. As to the second and third motor units 12 and 13, the positive angle in the above angular range is an angle in a direction in which the normal is closer to the first straight line L1 as the distance from the second axis AX2 increases. On the other hand, as to the first motor unit 11, since the second axis AX2 coincides with the central axis of the shaft 521 of the motor 520, it does not matter whether the angle in the above angular range is positive or negative.

By setting the angles θ11, θ12, and θ13 to 0° or more and 45° or less, more preferably 20° or less, the dimension of the second arm A20 along the second direction D2 can be reduced. By setting the angles θ11, θ12, and θ13 to 5° or more, the dimensions of the first to third motor units 11, 12, and 13 including the cables 537 along the second direction D2 can be reduced. Further, by setting the angle θ12 of the second motor unit 12 to 5° or more, the normal direction N12 is inclined in a direction in which the normal is closer to the first straight line L1 as the distance from the second axis AX2 increases. Thus, in the external form of the arm main body 40 in the plan view as shown in FIG. 19, a wedge-shaped portion 40a where the width thereof along the second direction D2 narrows as it approaches the third axis AX3 from the second axis AX2 is formed along the first straight line L1. The wedge-shaped portion 40a is provided, in the longitudinal direction of the arm main body 40, in a region from the second and third motor units 12 and 13 to the tip on the third axis AX3 side. The wedge-shaped portion 40a is provided, so that as a result, the area of movement of the second arm can be widened.

Figure 21:
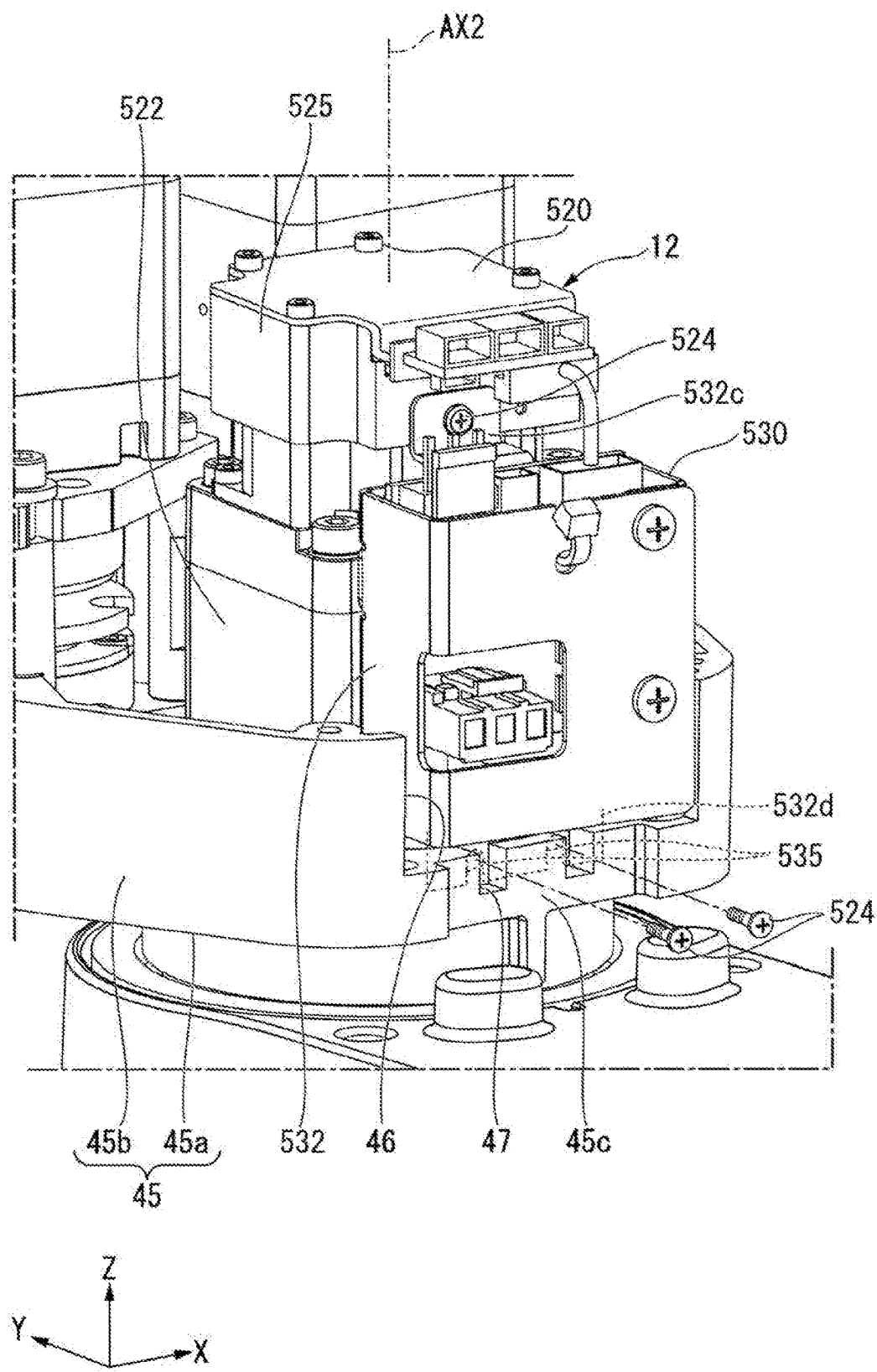
FIG. 21 is a partial perspective view of an arm main body of the third embodiment.

FIG. 21 is a partial perspective view of the arm main body 40, showing surroundings of the first motor unit 11.

The side wall portion 45b of the lower cover 45 is provided with a low wall portion 45c where the projection height from the bottom plate portion 45a is locally lowered. The first opening 46 opened in the horizontal direction (the direction orthogonal to the second axis AX2) from the inside to the outside of the lower cover 45 is formed above the low wall portion 45c. That is, the side wall portion 45b of the lower cover 45 is provided with the first opening 46. The low wall portion 45c is provided with second openings 47 having a notch shape extending downward from the upper edge. The second opening 47 is opened in a direction orthogonal to the second axis AX2.

The amplifier section 530 of the first motor unit 11 is disposed in the first opening 46. A portion of the amplifier section 530 of the first motor unit 11 is located outside the arm main body 40 via the first opening 46. The first motor unit 11 is covered by the arm cover 41 in the horizontal direction and from above in the state where the arm cover 41 (see FIG. 17) is attached to the arm main body 40.

The amplifier section 530 of the first motor unit 11 is fixed to the motor 520 via the first and second leg plate portions 532c and 532d of the bracket 532. The first leg plate portion 532c is located on the upper end side of the bracket 532, and the second leg plate portion 532d is located on the lower end side of the bracket 532.

The first leg plate portion 532c of the bracket 532 is provided with a hole (not shown), and the screw 524 is inserted into the screw hole 523 (see FIG. 20) on the motor 520 side via the hole. Thus, the first leg plate portion 532c is fixed to the motor 520.

The second leg plate portion 532d is provided with notch portions 535 extending upward from the lower edge. The screw (fixing member) 524 for fixing the amplifier section 530 to the bracket 532 is located inside the notch portion 535. The screws 524 located inside the notch portions 535 are inserted into the screw holes 523 on the motor 520 side, so that the second leg plate portion 532d is fixed to the motor 520. The second leg plate portion 532d faces the low wall portion 45c of the lower cover 45. The second opening 47 provided in the low wall portion 45c is formed along the axis of the screws 524. The user inserts a driver into the second opening 47 and rotates the screw 524.

According to the embodiment, the first opening 46 is provided in the lower cover 45 of the arm main body 40, and a portion of the amplifier section 530 is located outside the arm main body 40 in the plan view via the first opening 46. Hence, compared to the case where the side wall portion 45b is extended to the outside of the amplifier section 530 in order to locate the amplifier section 530 of the first motor unit 11 inside the arm main body 40 in the plan view, the arm main body 40 can be formed compactly. As a result, the area of movement of the arm main body 40 can be widened.

In the embodiment, the case where a portion of the amplifier section 530 of the first motor unit 11 is located outside the arm main body 40 has been illustrated. However, the effect of compactness can be provided as long as at least a portion of the amplifier section 530 or the motor 520 is located outside the arm main body 40 in the plan view.

Moreover, in the embodiment, the case where the amplifier section 530 and the motor 520 are connected together to constitute the motor unit has been illustrated. However, even when the amplifier section 530 and the motor 520 are separately provided in the arm main body 40, the effect of compactness can be provided as long as at least a portion of the amplifier section 530 or the motor 520 is located outside the arm main body 40 in the plan view.

Further, the plurality of motors 520 or amplifier sections 530 may be located outside the arm main body 40.

Moreover, in the embodiment, the first opening 46 is formed in a notch shape extending downward from the upper end of the side wall portion 45b; however, the first opening 46 may be a through-hole penetrating the side wall portion 45b in the thickness direction.

According to the embodiment, since the amplifier section 530 is located outside the arm main body 40 in the plan view, the user's access at the time of maintenance can be facilitated. Moreover, the fixation of the amplifier section 530 at the second leg plate portion 532d is made by the screws 524 passing through the notch portions 535 of the second leg plate portion 532d. Hence, the amplifier section 530 is easily removed by loosening the screws 524 and moving the amplifier section 530 upward (in one direction).

In the embodiment, the first leg plate portion 532c is not provided with a notch portion, but the screw 524 is inserted through the hole of the first leg plate portion 532c. Hence, it is necessary in removing the amplifier section 530 to pull out the screw 524 fixing the first leg plate portion 532c. The process of removing the amplifier section 530 from the motor 520 may be further facilitated by providing a notch portion, instead of the hole, in the first leg plate portion 532c.

Moreover, in the embodiment, the case where the screws 524 are adopted as fixing members that fix the amplifier section 530 and the motor 520 together has been described. As the fixing member, a combination of a drive pin extending from the motor 520 and a retaining ring may be used other than the screw.

According to the embodiment, since the amplifier section 530 of the first motor unit 11 is located outside the arm main body 40, heat dissipating efficiency of the amplifier section 530 can be increased. The plurality of motors 520 and the plurality of amplifier sections 530 are disposed in a concentrated manner inside the arm main body 40, and therefore, heat is likely to build up therein. Moreover, the first motor unit 11 requires a large torque to drive the rotating shaft body 502, which easily results in a large operating current and heat generation. By disposing the amplifier section 530 of the first motor unit 11 outside the arm main body 40, the amplifier section 530 generating a large amount of heat can be spaced apart from other heat sources (other motors and other amplifier sections) to thereby increase heat dissipating efficiency.

According to the embodiment as shown in FIG. 18, the gap D is provided between the arm cover 41 and the arm main body 40. Since the arm main body 40 is located outside the amplifier section 530, the air flowing in through the gap D directly cools the amplifier section 530. Further, according to the embodiment, since the arm cover 41 is provided with the vent hole 41a, the flowing air can be discharged from the upper side, and thus the circulation of air cooling the amplifier section 530 can be formed. Thus, it is expected to further improve the efficiency of cooling the amplifier section 530. Moreover, since the vent hole 41a is located directly above the amplifier section 530, the air warmed by the amplifier section 530 can be efficiently discharged.

Other than the configuration illustrated in the embodiment, the configuration of the vent hole 41a of the arm cover 41 may be such that, for example, a plurality of vent holes are provided in the side surface of the arm cover 41 extending in the circumferential direction of the second axis AX2. In this case, air can be taken into the second arm A20 via the vent holes every time the second arm A20 operates.

Further, as shown by the dashed-double dotted lines in FIG. 18, the arm cover 41 may be provided with filters 48 externally covering the gap D and the vent hole 41a. The filter 48 may be located on the internal side of the second arm A20. The filter 48 prevents dust or the like from moving from the inside to the outside of the second arm A20 or from the outside to the inside thereof. Thus, it is possible to provide the robot 501 that can be used in a clean room or the like. In addition, a structure may be adopted in which the airtightness in the second arm A20 is increased by covering the gap D and the vent hole 41a with packings or the like.

Modified Example 1

Figure 22:
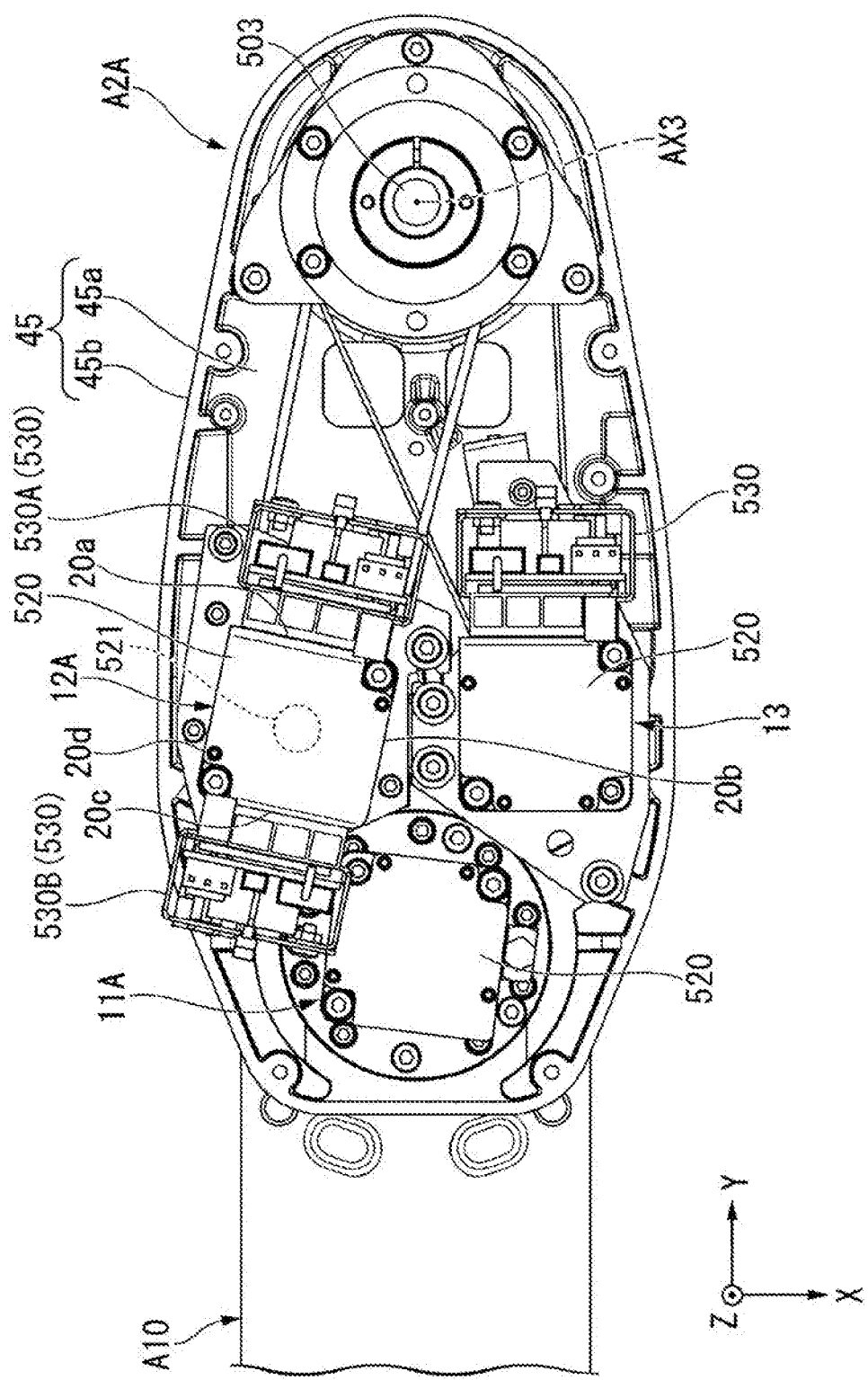
FIG. 22 is a plan view of a second arm of Modified Example 1.

FIG. 22 is a plan view of a second arm A2A of Modified Example 1.

The second arm A2A of the modified example differs, compared to the second arm A20 of the third embodiment described above, mainly in the arrangement of the amplifier section 530. Components each having the same form as that of the third embodiment described above are denoted by the same reference numerals and signs, and the description of the components is omitted.

The second arm A2A is provided with a first motor unit 11A, a second motor unit 12A, and the third motor unit 13. Each of the first to third motor units 11A, 12A, and 13 includes the motor 520 and the amplifier section 530. Here, the amplifier section 530 of the first motor unit 11A is referred to as "second amplifier section 530B", and the amplifier section 530 of the second motor unit 12A is referred to as "first amplifier section 530A". In this case, both the first and second amplifier sections 530A and 530B are fixed to the motor 520 of the second motor unit 12A.

Figure 23:
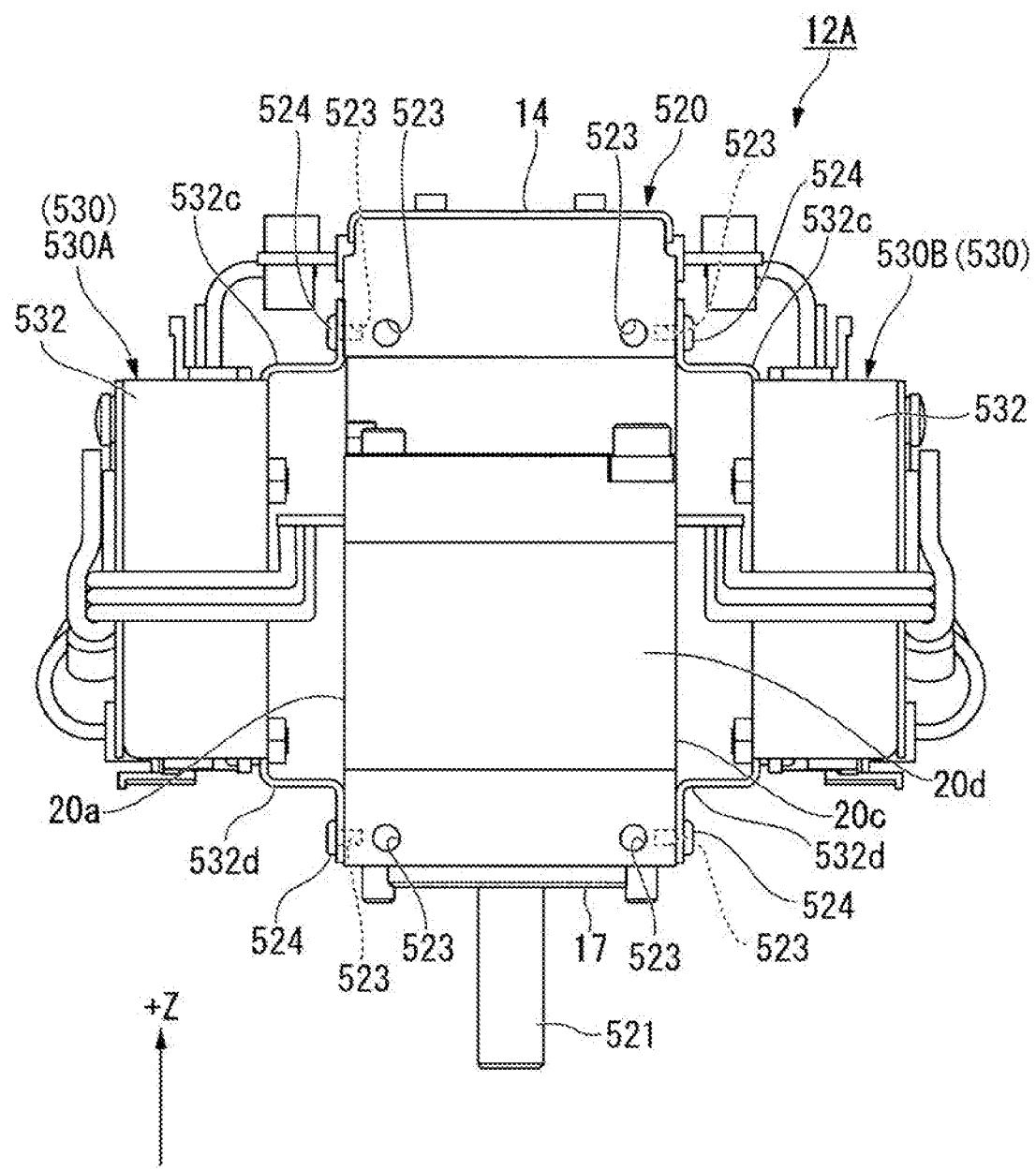
FIG. 23 is a side view of a second motor unit of Modified Example 1.

FIG. 23 is a side view of the second motor unit 12A.

The first amplifier section 530A is attached to the first surface 20a of the motor 520 of the second motor unit 12A, and the second amplifier section 530B is attached to the third surface 20c thereof. That is, in the second motor unit 12A, the first amplifier section 530A is detachably attached at the screw holes (first attachment/detachment portions) 523 provided in the first surface 20a of the motor 520, and the second amplifier section 530B is detachably attached at the screw holes (second attachment/detachment portions) 523 provided in the third surface 20c.

According to the modified example, the motor 520 has a plurality of attachment positions (the first to fourth surfaces 20a, 20b, 20c, and 20d), so that a plurality of amplifier sections 530 can be attached to one motor 520. Thus, the flexibility of member arrangement can be increased within the second arm A2A, and as a result, the compactness of the second arm A2A can be achieved.

According to the modified example, the shaft (rotating shaft) 521 of the motor (first motor) 520 of the second motor unit 12 is provided between the first surface 20a to which the first amplifier section 530A is attached and the third surface 20c to which the second amplifier section 530B is attached. That is, the first and second amplifier sections 530A and 530B are disposed in directions opposite to each other with respect to the motor 520 of the second motor unit 12A. Thus, the first and second amplifier sections 530A and 530B and the motor 520 are configured to be arrayed in one direction in the plan view. When the second arm A2A is increased in size in the width direction (transverse direction), the range of movement is narrowed. On the other hand, it is easy in the second arm A2A to secure the accommodating space in the longitudinal direction. The width dimension of the second arm A2A can be reduced by making the array direction of the first and second amplifier sections 530A and 530B and the motor 520 coincident with the longitudinal direction of the second arm A2A.

The brackets 532 of the first and second amplifier sections 530A and 530B have high heat dissipating efficiency and function as heat sinks. According to the modified example, the operating efficiency of the motor 520 can be increased by providing the motor 520 having a high frequency of operation or a large operating torque with the plurality of amplifier sections (the first and second amplifier sections 530A and 530B).

Modified Example 2

Figure 24:
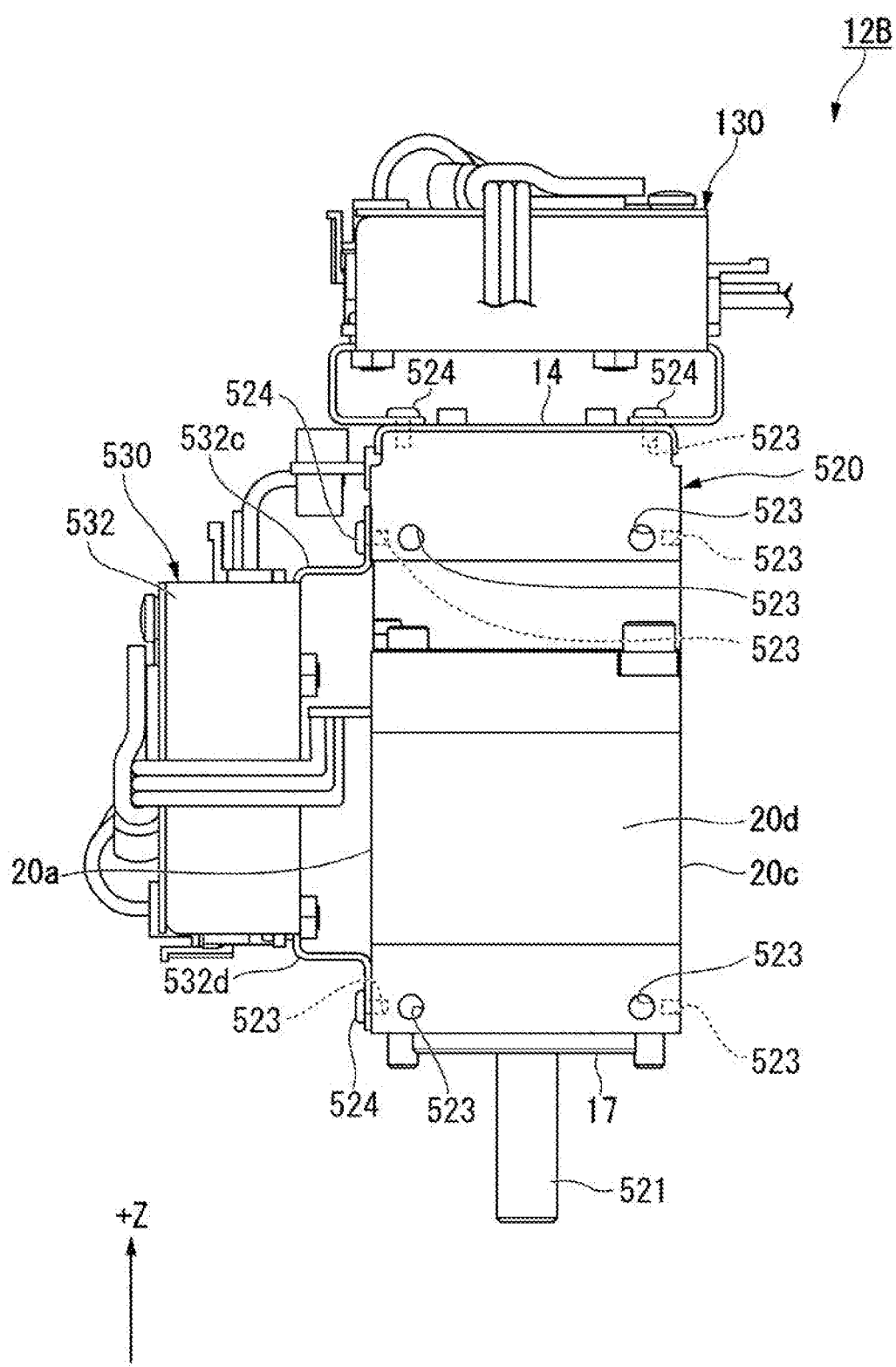
FIG. 24 is a side view of a motor unit of Modified Example 2.

FIG. 24 is a side view of a second motor unit 12B of Modified Example 2.

In the second motor unit 12B of the modified example, one motor 520 supports two amplifier sections 530 and 130 similarly to the second motor unit 12A of Modified Example 1.

Each of the upper surface 14 and the first to fourth surfaces 20a, 20b, 20c, and 20d of the motor 520 of the second motor unit 12B is provided with the screw holes (attachment/detachment portions) 523 for fixing the amplifier section. In the modified example, one amplifier section 530 is fixed to the motor 520 at the screw holes 523 in the first surface 20a, and the other amplifier section 130 is fixed to the motor 520 at the screw holes 523 in the upper surface 14.

According to the modified example, a space above the motor 520 can be effectively utilized within the second arm A20 by fixing the amplifier section 130 to the upper surface 14 of the motor 520, and as a result, the second arm A20 can be made compact.

Modified Example 3

Figure 25:
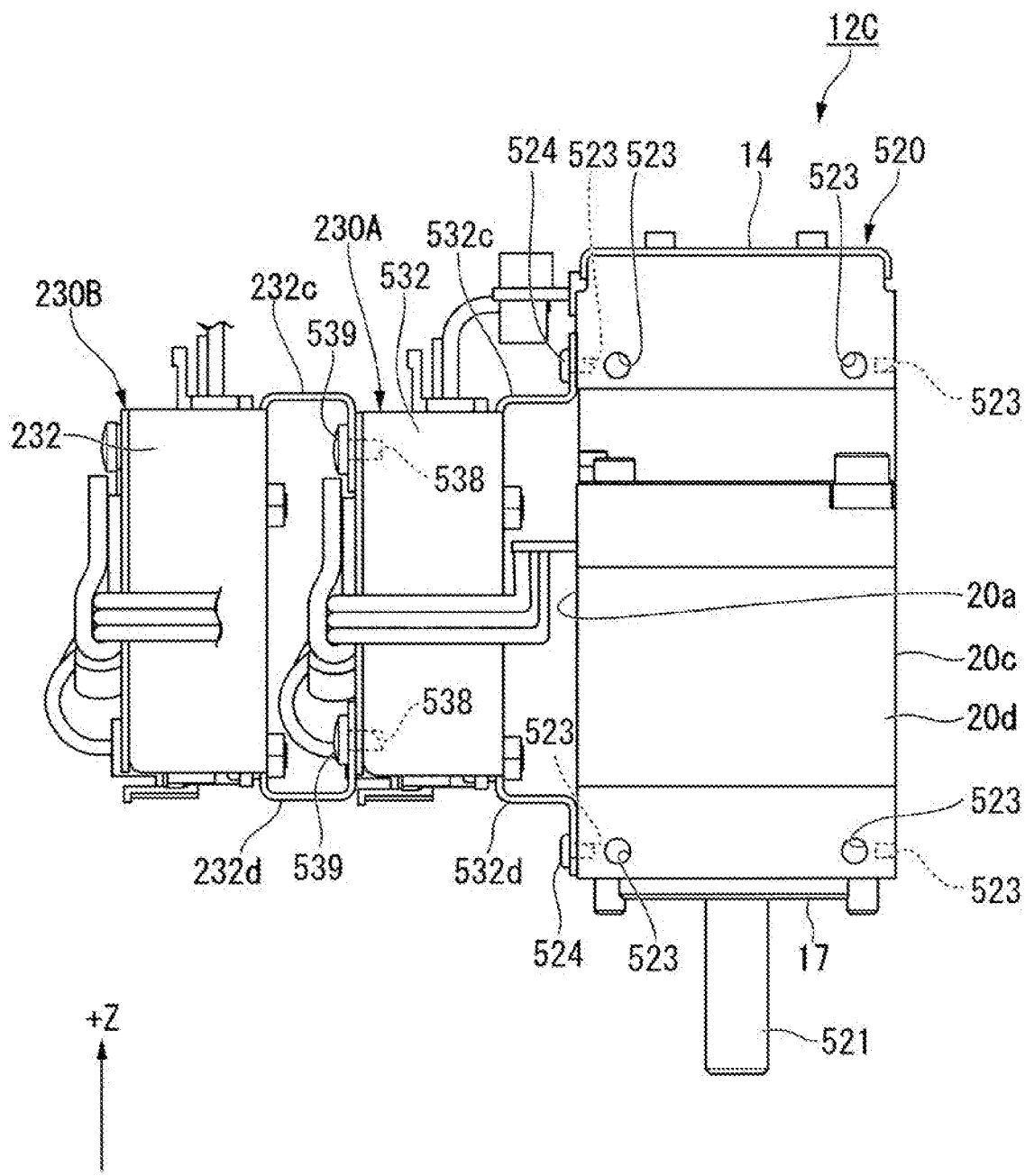
FIG. 25 is a side view of a motor unit of Modified Example 3.

FIG. 25 is a side view of a second motor unit 12C of Modified Example 3.

In the second motor unit 12C of the modified example, one motor 520 supports two amplifier sections (a first amplifier section 230A and a second amplifier section 230B) similarly to the second motor unit 12A of Modified Example 1.

The first amplifier section 230A drives the motor (first motor) 520 of the second motor unit 12C. The second amplifier section 230B drives the motor (second motor) 520 that is different from the motor 520 of the second motor unit 12C. The relationship between the first and second amplifier sections 230A and 230B and the motors 520 driven by the first and second amplifier sections 230A and 230B may be opposite to the relationship described above. Moreover, both the first and second amplifier sections 230A and 230B may drive the different motor 520.

The first amplifier section 230A is fixed at the screw holes 523 provided in the first surface 20a of the motor 520 of the second motor unit 12C. That is, the motor (first motor) 520 includes the screw holes (first attachment/detachment portions) 523 allowing the first amplifier section 230A to be attachable/detachable.

The first amplifier section 230A is provided with screw holes (third attachment/detachment portions) 538 allowing the second amplifier section 230B to be attachable/detachable. The second amplifier section 230B is fixed with screws 539 at the screw holes 538 of the first amplifier section 230A. That is, the second amplifier section 230B is supported to the motor 520 via the first amplifier section 230A.

According to the modified example, the motor 520 supports the plurality of amplifier sections (the first and second amplifier sections 230A and 230B) stacked together, so that the flexibility of member arrangement can be increased within the second arm A20. Thus, the compactness of the second arm A20 can be achieved.

Moreover, according to the modified example, the first and second amplifier sections 230A and 230B and the motor 520 are configured to be arrayed in one direction in the plan view. The width dimension of the second arm A20 can be reduced by making the array direction of the first and second amplifier sections 230A and 230B and the motor 520 coincident with the longitudinal direction of the second arm A20.

In the modified example, the second amplifier section 230B is fixed to the motor 520 via the first amplifier section (intervening member) 230A. The first amplifier section 230A is fixed at the screw holes (attachment/detachment portions) 523 provided in the first surface 20a of the motor 520. Hence, the first amplifier section 230A as an intervening member is provided between the screw holes 523 and the second amplifier section 230B. In this manner, the amplifier section may be fixed to the motor 520 via an intervening member. Herein, the case where the first amplifier section 230A functions as an intervening member has been illustrated; however, the intervening member may be a separately prepared member.

Fourth Embodiment

Figure 26:
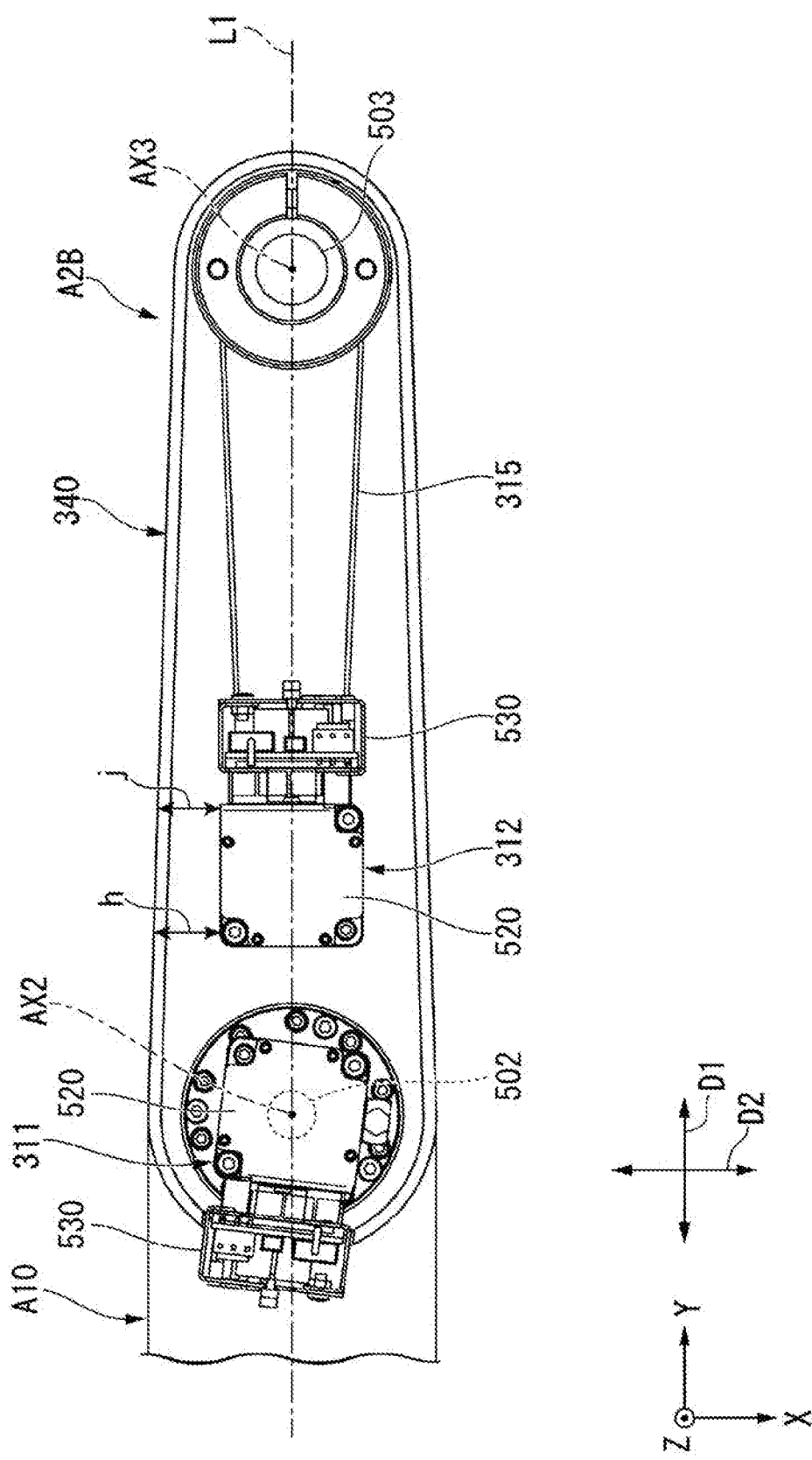
FIG. 26 is a plan view of a second arm of a fourth embodiment.

FIG. 26 is a plan view of a second arm A2B of a fourth embodiment.

The second arm A2B of the embodiment differs, compared to the second arm A20 of the third embodiment, in the number of motor units provided in an arm main body 340. Components each having the same form as that of the embodiments described above are denoted by the same reference numerals and signs, and the description of the components is omitted.

The second arm A2B includes the arm main body 340, a first motor unit 311, a second motor unit 312, the rotating shaft body 502 extending along the second axis (rotation axis) AX2, and the actuating shaft body 503 extending along the third axis (actuation axis) AX3. The arm main body 340 holds the first and second motor units 311 and 312, the actuating shaft body 503, and the rotating shaft body 502.

Each of the first and second motor units 311 and 312 includes the motor 520 and the amplifier section 530. The first motor unit 311 rotationally drives the rotating shaft body 502 with respect to the arm main body 340. The second motor unit 312 rotates a ball screw nut via a timing belt 315 to thereby raise or lower the actuating shaft body 503.

In the plan view, a shortest distance j along the second direction D2 between the motor 520 of the second motor unit 312 and the outer edge of the arm main body 340 is shorter than the thickness of the amplifier section 530 (i.e., the length of the amplifier section 530 in the normal direction of the amplifier board 531 (see FIG. 20)). Thus, the distance between the motor 520 and the outer edge of the arm main body 340 can be shortened to reduce the dimension of the arm main body 340 along the second direction D2.

In the plan view, a longest distance h along the second direction D2 between the motor 520 of the second motor unit 312 and the outer edge of the arm main body 340 is shorter than the thickness of the amplifier section 530. Hence, a gap in which the amplifier section 530 is provided is not present between the outer edge of the arm main body 340 and the motor 520 of the second motor unit 312. As a result, the dimension of the second arm A2B along the second direction D2 can be reduced.

Fifth Embodiment

Figure 27:
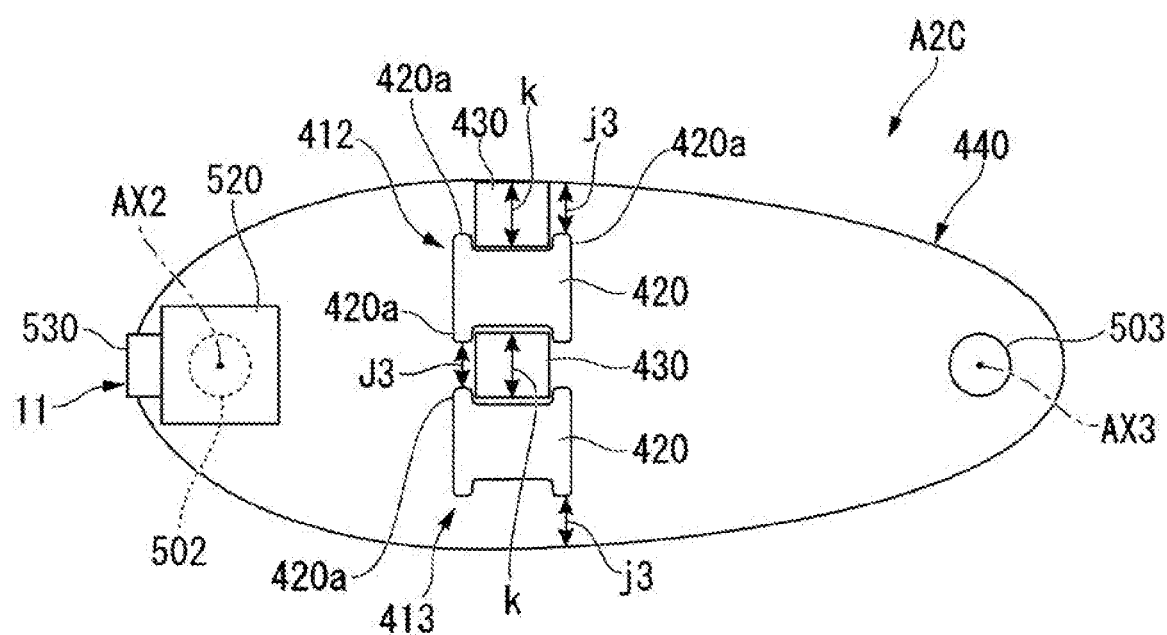
FIG. 27 is a schematic plan view of a second arm of a fifth embodiment.

FIG. 27 is a schematic plan view of a second arm A2C of a fifth embodiment.

The second arm A2C of the embodiment differs, compared to the second arm A20 of the third embodiment, in the configuration of a motor 420 provided in an arm main body 440. Components each having the same form as that of the embodiments described above are denoted by the same reference numerals and signs, and the description of the components is omitted.

The second arm A2C includes the arm main body 440, the first motor unit 11, a second motor unit 412, a third motor unit 413, the rotating shaft body 502 extending along the second axis (rotation axis) AX2, and the actuating shaft body 503 extending along the third axis (actuation axis) AX3.

The first motor unit 11 has a configuration similar to that of the third embodiment. Each of the second and third motor units 412 and 413 includes the motor 420 and an amplifier section 430. The second motor unit 412 rotates a ball screw nut via a timing belt (not shown) to thereby raise or lower the actuating shaft body 503. The third motor unit 413 rotates the actuating shaft body 503 around the third axis AX3 via a timing belt (not shown). The second motor unit 412 and the third motor unit 413 are disposed to be arranged in the second direction D2.

The motors 420 of the second and third motor units 412 and 413 have a rectangular shape in the plan view. Projecting portions 420a are provided at the four corners of the motor 420. The projecting portions 420a project along the second direction D2.

The amplifier section 430 of the second motor unit 412 is disposed in the second direction D2 with respect to the motor 420 of the second motor unit 412. The amplifier section 430 is located between the projecting portions 420a of the motor 420.

The amplifier section 430 of the third motor unit 413 is disposed in the second direction D2 with respect to the motor 420 of the third motor unit 413 and between the motor 420 of the second motor unit 412 and the motor 420 of the third motor unit 413. The amplifier section 430 is located between the projecting portions 420a of the motor 420.

In the plan view, a shortest distance j3 along the second direction D2 between the motor 420 of the second motor unit 412 and the outer edge of the arm main body 440 is shorter than a thickness k of the amplifier section 430. Similarly, a shortest distance j3 along the second direction D2 between the motor 420 of the third motor unit 413 and the outer edge of the arm main body 440 is shorter than the thickness k of the amplifier section 430. The gap constituting the shortest distance j3 is located between the projecting portion 420a of the motor 420 and the outer edge of the arm main body 440. Thus, the distance between the motor 420 and the outer edge of the arm main body 440 can be shortened to reduce the dimension of the arm main body 440 along the second direction D2.

In the plan view, a shortest distance J3 along the second direction D2 between the motors 420 of the second and third motor units 412 and 413 is shorter than the thickness k of the amplifier section 430. The gap constituting the shortest distance J3 is located between the projecting portions 420a of the motors 420 of the second and third motor units 412 and 413. Thus, the distance between the motors 420 of the second and third motor units 412 and 413 can be shortened to reduce the dimension of the arm main body 440 along the second direction D2.

As shown in the embodiment, even when the amplifier sections 430 are disposed in the second direction with respect to the motors 420, a certain degree of effect can be provided for reducing the size of the arm main body 440 by making the shortest distances J3 and j3 each shorter than the thickness k of the amplifier section 430.

Although the various embodiments of the invention have been described above, the configurations in the embodiments and the combination of the configurations are illustrative only. Addition, omission, replacement, and other modifications of the configurations can be made within the scope not departing from the spirit of the invention. Moreover, the invention is not limited by the embodiments.

In the embodiments described above, the case where the robot is a horizontal articulated robot has been illustrated. The robot may be other robots such as a vertical articulated robot or a Cartesian-coordinate robot instead of a SCARA robot. The vertical articulated robot may be a single-arm robot including one manipulator, may be a dual-arm robot including two manipulators (a multi-arm robot including two manipulators), or may be a multi-arm robot including three or more manipulators. The Cartesian-coordinate robot is, for example, a gantry robot.

In the embodiments described above, the motor unit provided in the second arm has been mainly described. A configuration similar to that of the motor unit provided in the second arm can also be adopted for the motor unit in the base.

Moreover, in the embodiments described above, the case where the motor and the amplifier section are integrally configured as the motor unit has been mainly described. However, in the embodiments, the amplifier section may be configured such that the amplifier section is not fixed to the motor but is directly provided on the arm main body (or the second arm).

The entire disclosures of Japanese Patent Application Nos. 2016-107467, filed May 30, 2016; 2016-168983, filed Aug. 31, 2016; 2016-168984, filed Aug. 31, 2016; 2016-168985, filed Aug. 31, 2016; 2016-171540, filed Sep. 2, 2016 and 2017-027225, filed Feb. 16, 2017 are expressly incorporated by reference herein.

What is claimed is:

1. A motor unit comprising:
a motor; and
an amplifier section including a drive circuit that drives the motor, wherein
the amplifier section includes an amplifier board, an amplifier cover, and a heat dissipating member,
a power line for supplying power to the motor is bound to the amplifier cover, and
a cushioning member is disposed between the amplifier board and the heat dissipating member.

2. The motor unit according to claim 1, wherein the power line is bound to the outside of the amplifier cover.

3. The motor unit according to claim 1, wherein another wire is not interposed between the amplifier cover and the power line.

4. The motor unit according to claim 1, further comprising a waterproof cover covering at least one of the motor and the amplifier section.

5. The motor unit according to claim 1, wherein the material of the heat dissipating member is metal.

6. The motor unit according to claim 5, wherein the material of the heat dissipating member is any of iron, aluminum, and copper.

7. The motor unit according to claim 1, wherein the heat dissipating member can attach the amplifier section to the motor.

8. The motor unit according to claim 1, wherein the heat dissipating member can attach the amplifier section to an object other than the motor.

9. The motor unit according to claim 1, wherein the heat dissipating member includes a first opening.

10. The motor unit according to claim 1, wherein a heat dissipating sheet is disposed between the amplifier board and the heat dissipating member.

11. A motor unit comprising:
a motor; and
an amplifier section including a drive circuit that drives the motor, wherein
the amplifier section includes an amplifier board, an amplifier cover, and a heat dissipating member,
a power line for supplying power to the motor is bound to the amplifier cover, and
a heat dissipating sheet is disposed between the amplifier board and the heat dissipating member.

12. A robot comprising:
a motor unit;
wherein the motor unit includes
a motor, and
an amplifier section including a drive circuit that drives the motor, wherein
the amplifier section includes an amplifier board, an amplifier cover, and a heat dissipating member,
a power line for supplying power to the motor is bound to the amplifier cover, and
a cushioning member is disposed between the amplifier board and the heat dissipating member.

13. The robot according to claim 12, further comprising a housing, wherein
the amplifier section can be attached to the housing.

14. The robot according to claim 13, wherein the amplifier section is located inside the housing.

15. The robot according to claim 13, wherein the housing is movable.

16. The robot according to claim 13, wherein a portion of the housing, to which the amplifier section can be attached, is the heat dissipating member.

17. The robot according to claim 13, wherein the housing includes a second opening, and
a portion of the housing, to which the amplifier section can be attached, is a lid member covering at least a portion of the second opening.

18. The robot according to claim 17, wherein the material of the lid member is metal.

* * * * *